(12) United States Patent
Hu et al.

(10) Patent No.: US 9,589,935 B2
(45) Date of Patent: Mar. 7, 2017

(54) PACKAGE APPARATUS AND MANUFACTURING METHOD THEREOF

(71) Applicant: PHOENIX PIONEER TECHNOLOGY CO., LTD., Hsinchu County (TW)

(72) Inventors: Chu-Chin Hu, Hsinchu County (TW); Shih-Ping Hsu, Hsinchu County (TW); E-Tung Chou, Hsinchu County (TW)

(73) Assignee: PHOENIX PIONEER TECHNOLOGY CO., LTD., Hsinchu County (TW)

( * ) Notice: Subject to any disclaimer, the term of this patent is extended or adjusted under 35 U.S.C. 154(b) by 0 days.

(21) Appl. No.: 14/563,250

(22) Filed: Dec. 8, 2014

(65) Prior Publication Data

US 2016/0163677 A1    Jun. 9, 2016

(30) Foreign Application Priority Data

Oct. 9, 2014    (TW) .............................. 103135225 A

(51) Int. Cl.
*H01L 23/40*    (2006.01)
*H01L 25/04*    (2014.01)
(Continued)

(52) U.S. Cl.
CPC ...... *H01L 25/0657* (2013.01); *H01L 23/3107* (2013.01); *H01L 23/4012* (2013.01);
(Continued)

(58) Field of Classification Search
CPC ........... H01L 23/48; H01L 2225/06548; H01L 2225/0652; H01L 23/4012; H01L 25/043;
(Continued)

(56) References Cited

U.S. PATENT DOCUMENTS 8,039,303 B2 * 10/2011 Shim ..................... H01L 21/568
257/100
8,071,428 B2 * 12/2011 Pohl ....................... H01L 21/568
438/110

(Continued)

*Primary Examiner* — Phat X Cao
(74) *Attorney, Agent, or Firm* — WPAT, PC; Justin King; Douglas A. Hosack

(57) ABSTRACT

A package apparatus includes a first package module, a second package module and multiple conductive elements. The first package module includes a first molding compound layer, a first conductive pillar layer disposed in the first molding compound layer, a first internal component, and a first protection layer. The first internal component electrically connects to the first conductive pillar layer and disposed in the first molding compound layer. The first protection layer is disposed on the first molding compound layer and the first conductive pillar layer. The second package module includes a second molding compound layer, a second conductive pillar layer disposed in the second molding compound layer, and a second internal component. The second internal component electrically connects to the second conductive pillar layer and disposed in the second molding compound layer. The conductive elements are disposed between the first and the second conductive pillar layers.

20 Claims, 35 Drawing Sheets

(51) Int. Cl.

| | |
|---|---|
| *H01L 25/065* | (2006.01) |
| *H01L 25/00* | (2006.01) |
| *H01L 25/075* | (2006.01) |
| *H01L 25/11* | (2006.01) |
| *H01L 23/31* | (2006.01) |
| *H01L 23/498* | (2006.01) |
| *H01L 23/538* | (2006.01) |
| *H01L 25/10* | (2006.01) |
| *H01L 23/00* | (2006.01) |

(52) U.S. Cl.
CPC .... *H01L 23/49811* (2013.01); *H01L 23/5389* (2013.01); *H01L 25/043* (2013.01); *H01L 25/0756* (2013.01); *H01L 25/105* (2013.01); *H01L 25/117* (2013.01); *H01L 25/50* (2013.01); *H01L 24/16* (2013.01); *H01L 24/48* (2013.01); *H01L 2224/16227* (2013.01); *H01L 2224/48227* (2013.01); *H01L 2225/0651* (2013.01); *H01L 2225/0652* (2013.01); *H01L 2225/06517* (2013.01); *H01L 2225/06548* (2013.01); *H01L 2225/06572* (2013.01); *H01L 2225/1023* (2013.01); *H01L 2225/1035* (2013.01); *H01L 2225/1058* (2013.01); *H01L 2924/00014* (2013.01); *H01L 2924/181* (2013.01)

(58) Field of Classification Search
CPC . H01L 25/0657; H01L 25/0756; H01L 25/117
See application file for complete search history.

(56) References Cited

U.S. PATENT DOCUMENTS

| | | | |
|---|---|---|---|
| 2011/0285009 A1* | 11/2011 | Chi | H01L 21/561 257/693 |
| 2016/0056087 A1* | 2/2016 | Wu | H01L 23/3178 257/738 |
| 2016/0148857 A1* | 5/2016 | Lin | H01L 21/561 257/762 |

* cited by examiner providing a first package module while enabling the first package module to be comprised of: a first molding compound layer; a first conductive pillar layer, formed with a first surface and a second surface that are arranged opposite to the each other while being disposed in the first molding compound layer; a first internal component, electrically connected to the first conductive pillar layer while being disposed in the first molding compound layer; and a first protection layer, disposed on the first molding compound layer and the first surface of the first conductive pillar layer ⸺S1102 providing a second package module while enabling the second package module to be comprised of: a second molding compound layer; a second conductive pillar layer, formed with a first surface and a second surface that are arranged opposite to the each other while being disposed in the second molding compound layer; and a second internal component, electrically connected to the second conductive pillar layer while being disposed in the second molding compound layer ⸺S1104 providing a plurality of conductive elements to be disposed between the second surface of the first conductive pillar layer of the first package module and the second surface of the second conductive pillar layer of the second package module ⸺S1106

FIG. 11

PACKAGE APPARATUS AND MANUFACTURING METHOD THEREOF

FIELD OF THE INVENTION

The present invention relates to a package apparatus and manufacturing method thereof, and more particularly, to a semiconductor package apparatus and method for manufacturing the same.

BACKGROUND OF THE INVENTION

With the design trend in electronic devices is toward lighter, smaller, thinner but more functional devices with performance requirements continuing to increase, device manufacturers increasingly need specialty integrated circuit (IC) solutions for allowing billions of miniature electronic components to be densely packed in a small area. Thus, device manufacturers come up with innovative packaging techniques for embedding electronic components in a substrate while allowing shorter traces between the electronic components and the substrate. In addition, the layout area is increased by the use of built-up technique as the technology advances for achieving lighter, smaller, thinner and more functional high-performance devices.

Generally, most high-end chips are packaged by flip chip (FC) process, especially by a chip scale package (CSP) process, as those high-end chips are primarily being applied in smart phones, tablet computers, network communication devices, and notebook computers, whichever is generally operating under high-frequency and high-speed condition and required to be packed in a thin, small and light-weighted semiconductor package. As for the carrier for packaging, the popular design nowadays includes: small pitches between lines, high density, thin-type design, low manufacture cost, and high electrical characteristic.

Please refer to FIG. 1, which shows a conventional fiberglass substrate packaging structure. In FIG. 1, the fiberglass substrate packaging structure with molded interconnection system 1 includes a bump bonding structure 10A and a wire bonding structure 10B, and is structured for allowing a conductive pillar layer 110A to be embedded inside a fiberglass substrate 100A, whereas the fiberglass substrate 100A can be a bismaleimide triazine (BT) substrate or a FR-5 substrate. In addition, there is further a protection layer 120A and conductive elements 140A being disposed on the conductive pillar layer 110A while simultaneously allowing the bump bonding of certain internal components 130A to be disposed on the conductive pillar layer 110A, and a molding compound layer 150A to be disposed on the fiberglass substrate 100A. Similarly, the other conductive pillar layer 110B is also embedded inside the other fiberglass substrate 100B, and the fiberglass substrate 100B can be a bismaleimide triazine (BT) substrate or a FR-5 substrate. Furthermore, there is further a protection layer 120B and conductive elements 140B being disposed on the conductive pillar layer 110B while simultaneously allowing the wire bonding of certain internal components 130B to be disposed on the conductive pillar layer 110B, and a molding compound layer 150B to be disposed on the fiberglass substrate 100B.

It is noted that the aforesaid fiberglass substrate packaging structure with molded interconnection system 1 is formed by forming through mold via (TMV) on the molding compound layer 150A of the bump bonding structure 10A so as to be used for enabling the conductive elements 140A to connect electrically to conductive elements 140B of the wire bonding structure 10B.

However, the aforesaid conventional fiberglass substrate packaging structure is very costly for using a fiberglass substrate as its substrate and the thin-type fiberglass substrate can be easily deformed and wrapped. The conventional substrate including fiberglass will increase the difficulty of processing for laser via so that it cannot fit the need of fine pitch, and therefore make the wiring more troublesome; and as the blind/buried vias in the aforesaid multi-layered metal laminated structure are formed by the repetition of a laser via method, such repetition can be a complex and time consuming process. Since the electrical connections between the plural bonding structures in the package structure are achieved through the TMV whereas such TMV should be fabricated by the use of a laser via process, the whole package fabrication process can be very costly.

SUMMARY OF THE INVENTION

The present invention provides a package apparatus and the manufacturing method thereof, by which a molding compound layer is used as the major material in the manufacturing of a coreless substrate. The package module can be fabricating by the embedding of chips inside the coreless substrate to replace the function of a convention fiberglass substrate, and after a plurality of such package modules are formed, they are laminated and interconnected and packaged into a multi-chip package.

In an embodiment, a package apparatus comprises a first package module, a second package module and a plurality of conductive elements. The first package module comprises a first molding compound layer, a first conductive pillar layer, a first internal component, and a first protection layer. The first conductive pillar layer is disposed in the first molding compound layer and is formed with a first surface and a second surface arranged opposite to the first surface. The first internal component is electrically connected to the first conductive pillar layer while being disposed in the first molding compound layer. The first protection layer is disposed on the first molding compound layer and the first surface of the first conductive pillar layer. The second package module comprises a second molding compound layer, a second conductive pillar layer, and a second internal component. The second conductive pillar layer is disposed in the second molding compound layer and is formed with a first surface and a second surface arranged opposite to the first surface. The second internal component is electrically connected to the second conductive pillar layer while being disposed in the second molding compound layer. The plurality of conductive elements are disposed between the second surface of the first conductive pillar layer and the second surface of the second conductive pillar layer.

Corresponding to the above embodiment, a method for manufacturing a package apparatus comprises the steps of: providing a first package module; providing a second package module; providing a plurality of conductive elements to be disposed between the second surface of the first conductive pillar layer and the second surface of the second conductive pillar layer.

In another embodiment, a package apparatus comprises a first package module, a second package module and a plurality of conductive elements. The first package module comprises a first molding compound layer, a first conductive pillar layer, a first internal component, and a first protection layer. The first conductive pillar layer is disposed in the first molding compound layer and is formed with a first surface and a second surface arranged opposite to the first surface. The first internal component is electrically connected to the first conductive pillar layer while being disposed in the first molding compound layer. The first protection layer is disposed on the first molding compound layer and the first surface of the first conductive pillar layer. The second package module comprises a second molding compound layer, a second conductive pillar layer, and a second internal component. The second conductive pillar layer is disposed in the second molding compound layer and is formed with a first surface and a second surface arranged opposite to the first surface. The second internal component is electrically connected to the second conductive pillar layer while being disposed in the second molding compound layer. The plurality of conductive elements are disposed between the second surface of the first conductive pillar layer and the first surface of the second conductive pillar layer.

Corresponding to the above embodiment, a method for manufacturing a package apparatus comprises the steps of: providing a first package module; providing a second package module; providing a plurality of conductive elements disposed between the second surface of the first conductive pillar layer and the first surface of the second conductive pillar layer.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention and wherein:

FIG. 11 is a flow chart depicting steps performing in a method for manufacturing a package apparatus of the first embodiment.

DESCRIPTION OF THE EXEMPLARY EMBODIMENTS

For your esteemed members of reviewing committee to further understand and recognize the fulfilled functions and structural characteristics of the invention, several exemplary embodiments cooperating with detailed description are presented as the follows.

Figure 1:
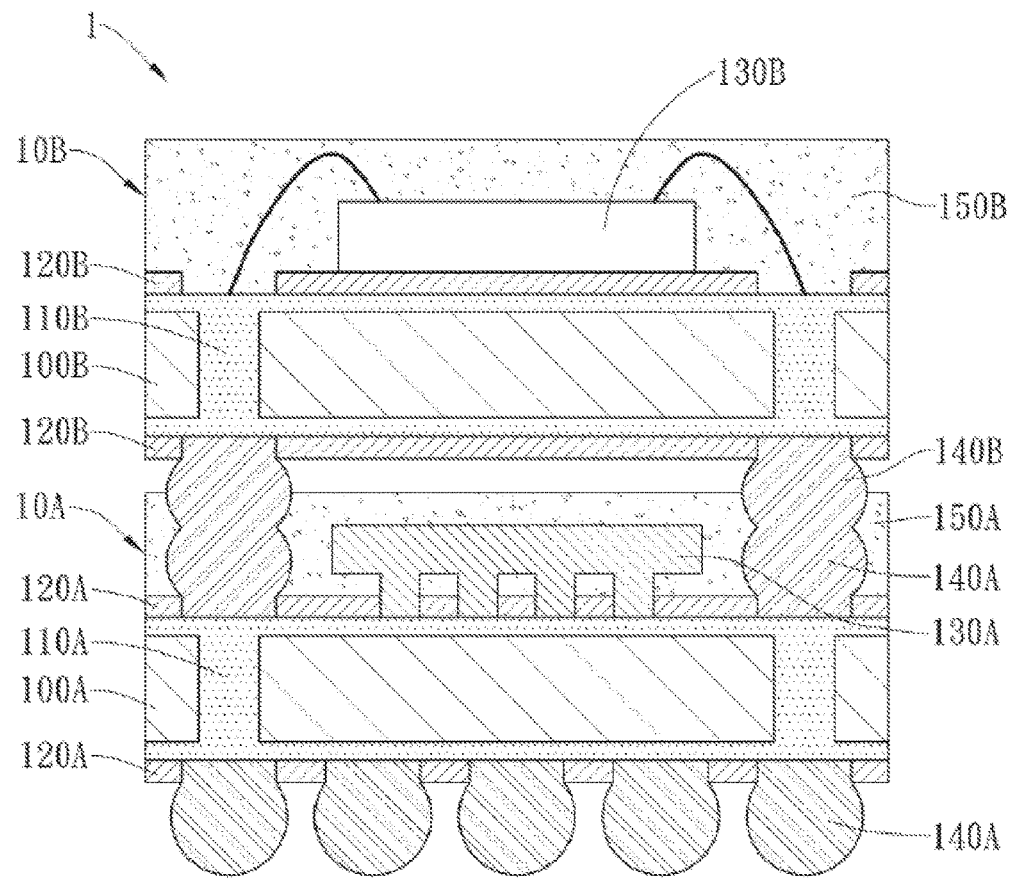
FIG. 1 shows a conventional fiberglass substrate packaging structure.
Figure 2A:
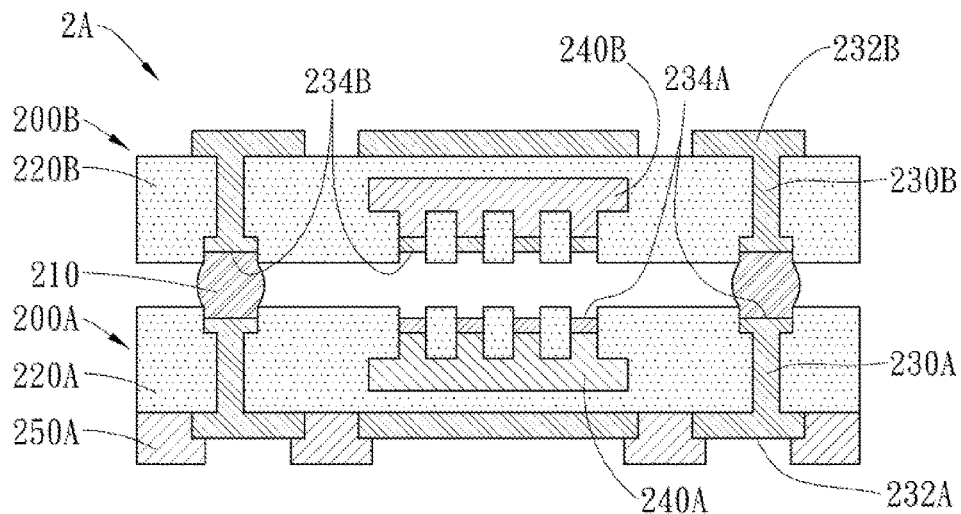
FIG. 2A is a schematic diagram showing a package apparatus according to a first embodiment of the present invention.

Please refer to FIG. 2A, which is a schematic diagram showing a package apparatus according to a first embodiment of the present invention. In FIG. 2A, a package apparatus 2A is disclosed, which comprises: a first package module 200A, a second package module 200B and a plurality of conductive elements 210. The first package module 200A comprises: a first molding compound layer 220A, a first conductive pillar layer 230A, a first internal component 240A, and a first protection layer 250A. The first conductive pillar layer 230A is formed with a first surface 232A and a second surface 234A that are arranged opposite to each other while being disposed in the first molding compound layer 220A. The first internal component 240A is electrical connected to the first conductive pillar layer 230A and disposed in the first molding compound layer 220A. The first protection layer 250A is disposed on the first molding compound layer 220A and the first surface 232A of the first conductive pillar layer 230A.

Similarly, the second package module 200B comprises: a second molding compound layer 220B, a second conductive pillar layer 230B, and a second internal component 240B. The second conductive pillar layer 220B is formed with a first surface 232B and a second surface opposite to each other and disposed in the second molding compound layer 220B. The second internal component 240B is electrical connected to the second conductive pillar layer 230B and disposed in the second molding compound layer 220B.

Moreover, the plural conductive elements 210 are disposed between the second surface 234A of the first conductive pillar layer 230A and the second surface 234B of the second conductive pillar layer 230B. In this embodiment, the plural conductive elements 210 are disposed outside an area enclosed and defined by the first internal component 240A and the second internal component 240B while being positioned between the second surface 234A of the first conductive pillar layer 230A and the second surface 234B of the second conductive pillar layer 230B. That is, there will be no such conductive elements 210 being disposed and packaged for electrical connection between the second surface 234A of the first conductive pillar layer 230A and the second surface 234B of the second conductive pillar layer 230B that is in an area defined by the enclosure of the first internal component 240A and the second internal component 240B, but the arrangement of the conductive elements 210 is not limited thereby.

In an embodiment of the present invention, each of the first molding compound layer 220A and the second molding compound layer 220B is made of a molding compound material for chip packaging that is selected from novolac-based resin, epoxy-based resin, silicon-based resin or other molding compounds, but is not limited thereby.

In another embodiment of the present invention, each of the second surface 234A of the first conductive pillar layer 230A and the second surface 234B of the second conductive pillar layer 230B includes at least one wire or at least one chip seat, whereas both the first conductive pillar layer 230A and the second conductive pillar layer 230B can be made of metal, such as copper. In addition, the second surface 234A of the first conductive pillar layer 230A and the second surface 234B of the second conductive pillar layer 230B can both be made as a ball grid array (BGA) electrode layer, by that the first internal component 240A can be electrically connected to the first conductive pillar layer 230A by either a wiring bonding manner or a bump bonding manner, and the second internal component 240B can also be electrically connected to the second conductive pillar layer 230B by either a wiring bonding manner or a bump bonding manner, whereas each of the first and the second internal components 240A, 240B is a component selected from an active component, a passive element, or a semiconductor chip. In the present embodiment, the first internal component 240A is electrically connected to the first conductive pillar layer 230A by a bump bonding manner, while the second internal component 240B is also electrically connected to the second conductive pillar layer 230B by a bump bonding manner, but it is not limited thereby.

In addition, the second surface 234A of the first conductive pillar layer 230A is either higher than or not higher than the first molding compound layer 220A, and similarly the second surface 234B of the second conductive pillar layer 230B is either higher than or not higher than the second molding compound layer 220B. In this embodiment, the second surface 234A of the first conductive pillar layer 230A is lower than the first molding compound layer 220A, while the second surface 234B of the second conductive pillar layer 230B is lower than the second molding compound layer 220B, but it is not limited thereby.

It is noted that in the embodiment a molding compound layer is used as the major material in the manufacturing of a coreless substrate, and moreover, a package module can be fabricating by the embedding of chips inside the coreless substrate to act as and replace the function of a convention fiberglass substrate so as to be used for replacing the role of a conventional fiberglass substrate, and after a plurality of such package modules are formed, they are laminated and interconnected and packaged into a multi-chip package.

The overall cost of the whole package process can be reduced, the size and thickness of the resulted package structure can also be reduced significantly, and thereby, it can be used for achieving a thinner, lighter and smaller electronic product with great portability. Moreover, as the internal components are embedded inside the structure, the whole transmission path in the structure is shortened for facilitating the requirement of high-speed signal transmission, noise reduction and power consumption, and also the reliability of three-dimension packaging is enhanced.

Figure 2B:
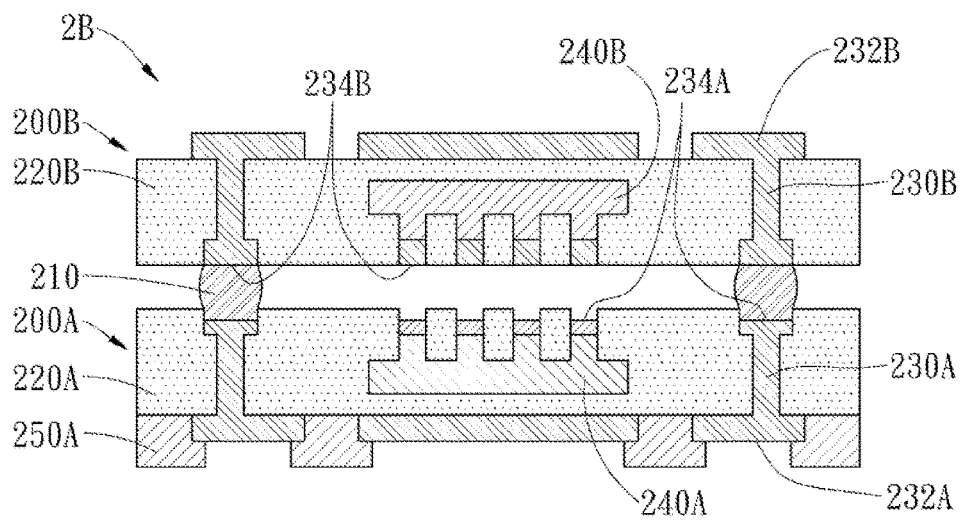
FIG. 2B is a schematic diagram showing a package apparatus according to a second embodiment of the present invention.

Please refer to FIG. 2B, which is a schematic diagram showing a package apparatus according to a second embodiment of the present invention. The package apparatus 2B of this second embodiment is structured similar to the package apparatus 2A of the first embodiment, but it is different in that: in the package apparatus 2B, the second surface 234B of the second conductive pillar layer 230B is positioned coplanar with the second molding compound layer 220B, but it is not limited thereby.

Figure 2C:
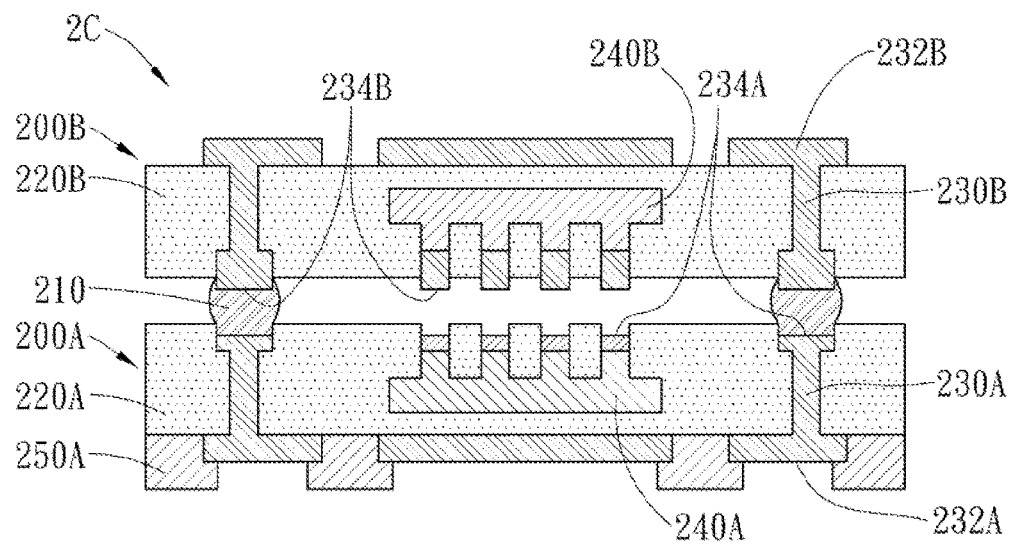
FIG. 2C is a schematic diagram showing a package apparatus according to a third embodiment of the present invention.

Please refer to FIG. 2C, which is a schematic diagram showing a package apparatus according to a third embodiment of the present invention. The package apparatus 2C of this third embodiment is structured similar to the package apparatus 2A of the first embodiment, but it is different in that: in the package apparatus 2C, the second surface 234B of the second conductive pillar layer 230B is higher than the second molding compound layer 220B, but it is not limited thereby.

Figure 2D:
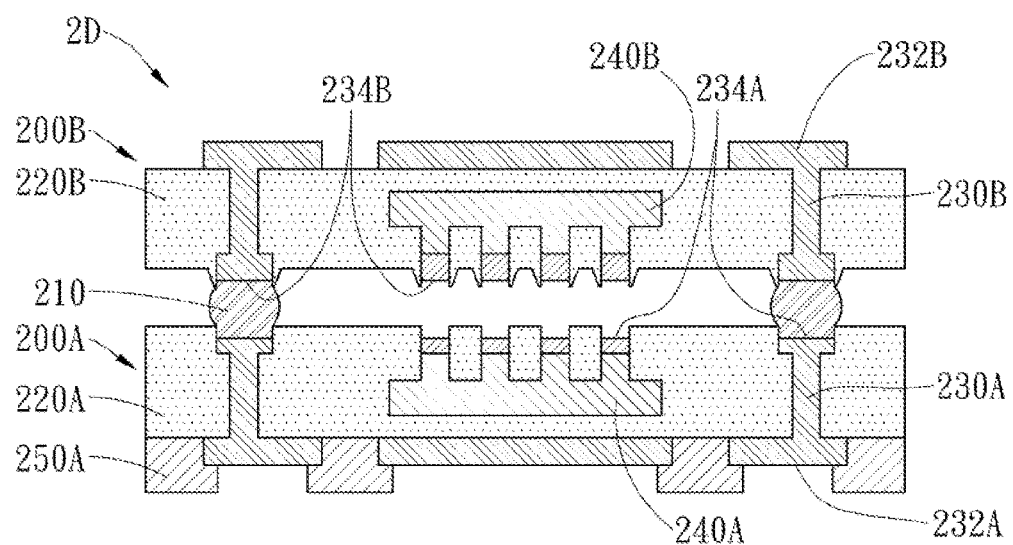
FIG. 2D is a schematic diagram showing a package apparatus according to a fourth embodiment of the present invention.

Please refer to FIG. 2D, which is a schematic diagram showing a package apparatus according to a fourth embodiment of the present invention. The package apparatus 2D of this fourth embodiment is structured similar to the package apparatus 2A of the first embodiment, but it is different in that: in the package apparatus 2D, the second surface 234B of the second conductive pillar layer 230B is lower than the second molding compound layer 220B, while allowing the second molding compound layer 220B to be formed covering all the lateral surface of the second surface 234B of the second conductive pillar layer 230B, but it is not limited thereby.

Figure 2E:
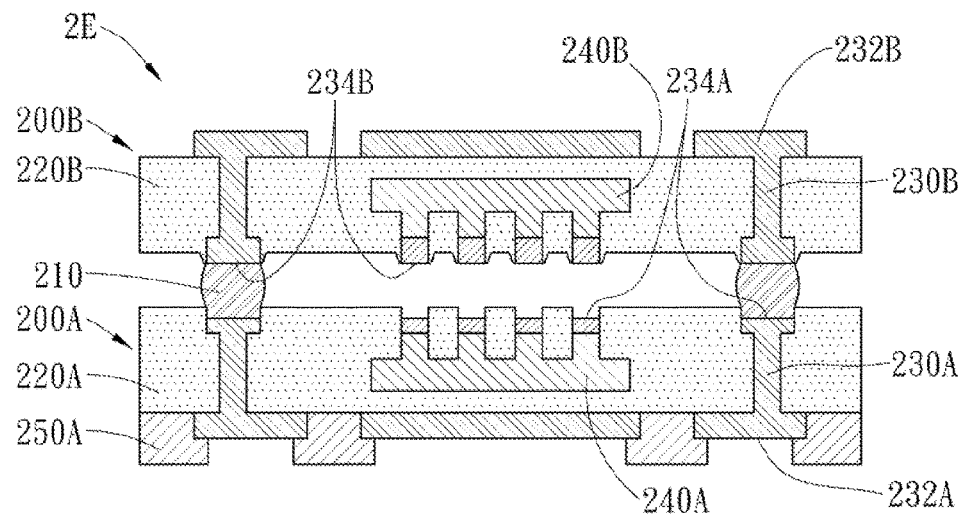
FIG. 2E is a schematic diagram showing a package apparatus according to a fifth embodiment of the present invention.

Please refer to FIG. 2E, which is a schematic diagram showing a package apparatus according to a fifth embodiment of the present invention. The package apparatus 2E of this fifth embodiment is structured similar to the package apparatus 2D of the fourth embodiment, but it is different in that: in the package apparatus 2E, the second surface 234B of the second conductive pillar layer 230B is positioned coplanar with the second molding compound layer 220B, while allowing the second molding compound layer 220B to be formed covering all the lateral surface of the second surface 234B of the second conductive pillar layer 230B, but it is not limited thereby.

Figure 2F:
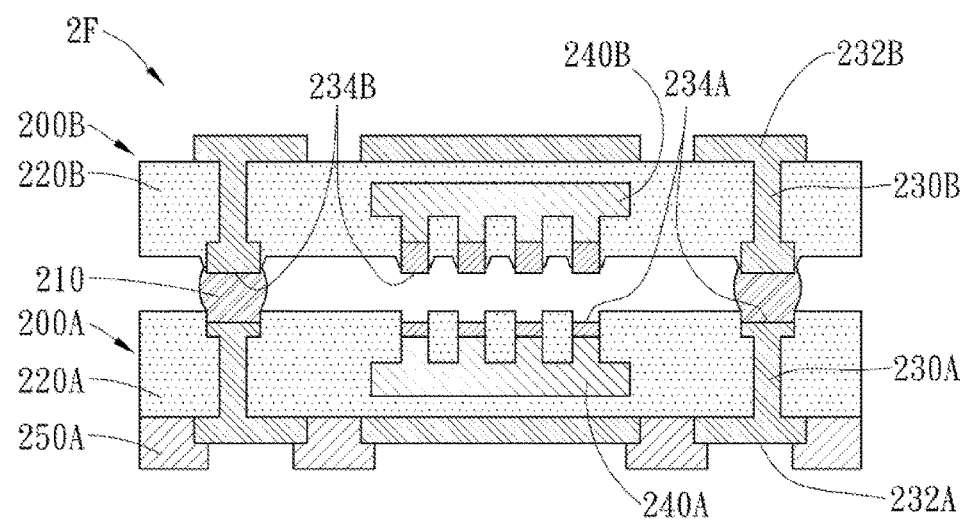
FIG. 2F is a schematic diagram showing a package apparatus according to a sixth embodiment of the present invention.

Please refer to FIG. 2F, which is a schematic diagram showing a package apparatus according to a sixth embodiment of the present invention. The package apparatus 2F of this sixth embodiment is structured similar to the package apparatus 2D of the fourth embodiment, but it is different in that: in the package apparatus 2F, the second surface 234B of the second conductive pillar layer 230B is higher than the second molding compound layer 220B, while allowing the second molding compound layer 220B to be formed covering a specific portion of the lateral surface of the second surface 234B of the second conductive pillar layer 230B, but it is not limited thereby.

Figure 3A:
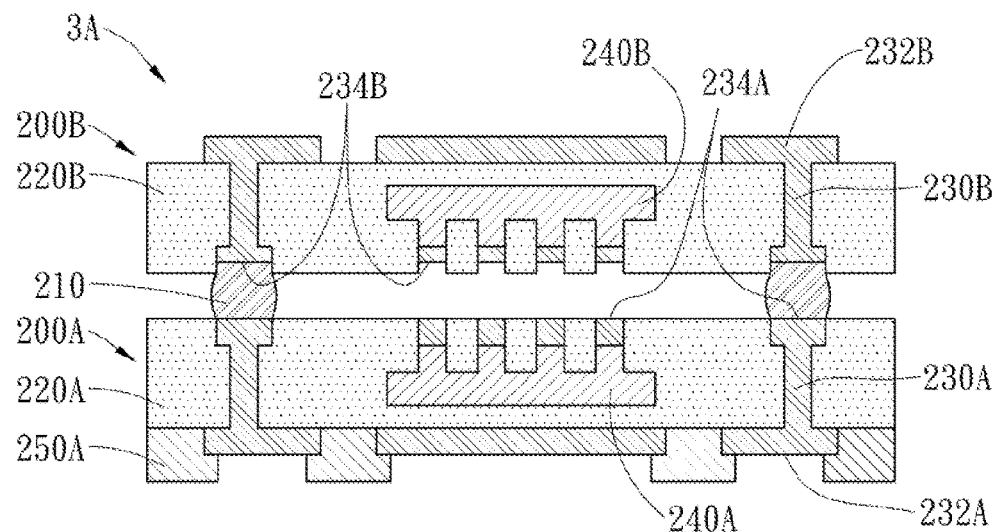
FIG. 3A is a schematic diagram showing a package apparatus according to a seventh embodiment of the present invention.
Figure 3B:
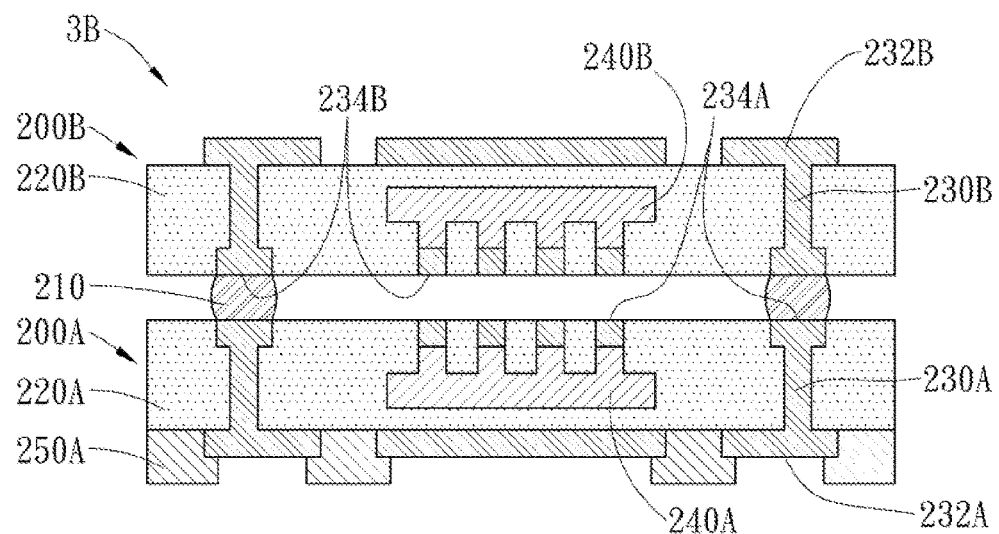
FIG. 3B is a schematic diagram showing a package apparatus according to an eighth embodiment of the present invention.
Figure 3C:
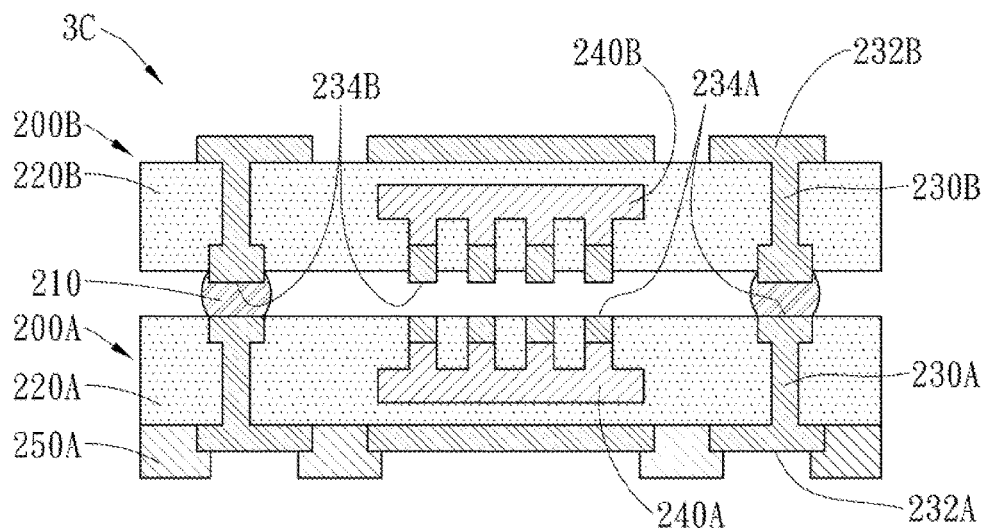
FIG. 3C is a schematic diagram showing a package apparatus according to a ninth embodiment of the present invention.
Figure 3D:
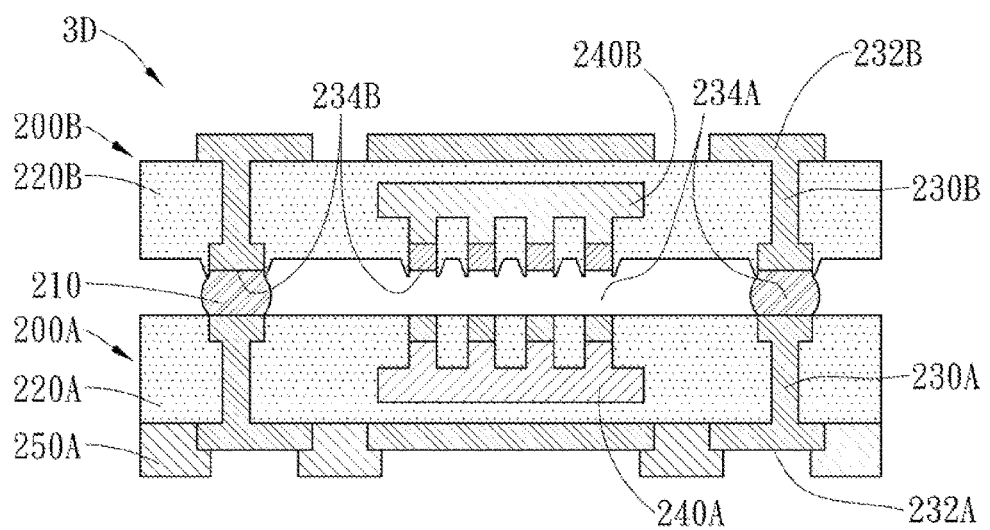
FIG. 3D is a schematic diagram showing a package apparatus according to a tenth embodiment of the present invention.
Figure 3E:
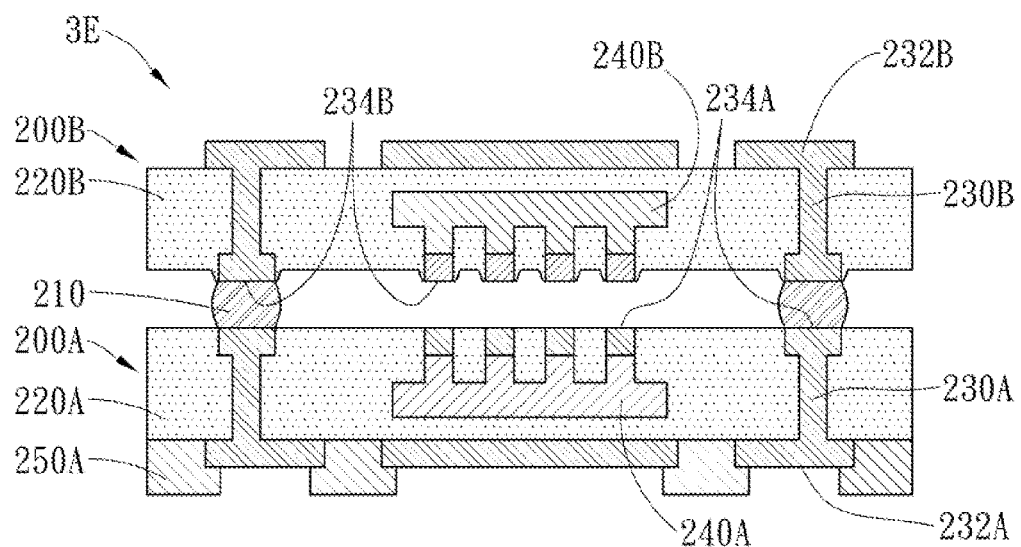
FIG. 3E is a schematic diagram showing a package apparatus according to an eleventh embodiment of the present invention.
Figure 3F:
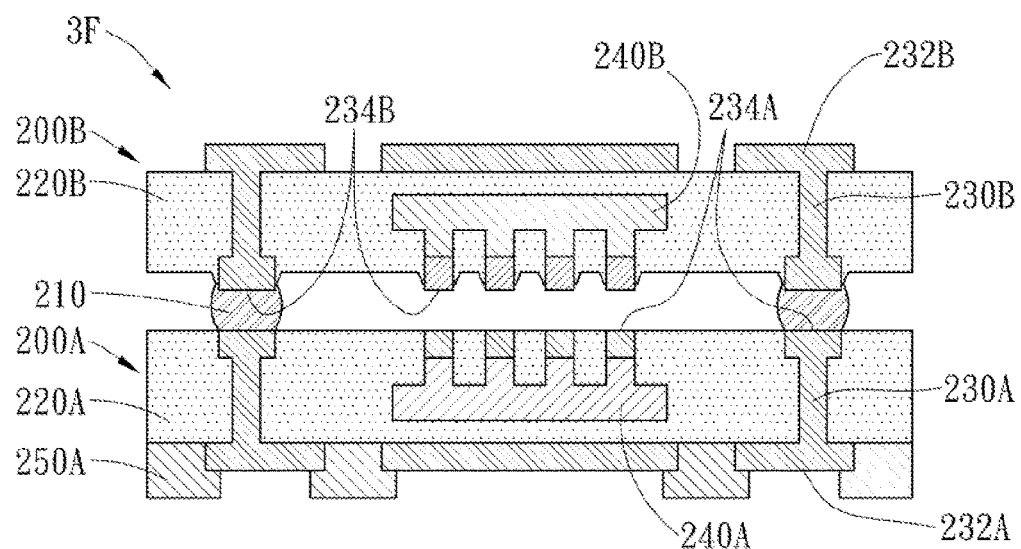
FIG. 3F is a schematic diagram showing a package apparatus according to a twelfth embodiment of the present invention.

Please refer to FIG. 3A, which is a schematic diagram showing a package apparatus according to a seventh embodiment of the present invention. The package apparatus 3A of this seventh embodiment is structured similar to the package apparatus 2A of the first embodiment, but is different in that: in the package apparatus 3A, the second surface 234A of the first conductive pillar layer 230A is positioned coplanar with the first molding compound layer 220A, despite that the second surface 234B of the second conductive pillar layer 230B is lower than the second molding compound layer 220B, but it is not limited thereby.

Please refer to FIG. 3B to FIG. 3F, which are schematic diagrams respectively showing a package apparatus according to an eighth embodiment to a twelfth embodiment of the present invention. Each of the package apparatuses 3B~3F of these embodiments is structured similar to the package apparatus 3A of the seventh embodiment, that is, the second surface 234A of the first conductive pillar layer 230A is positioned coplanar with the first molding compound layer 220A, but it is different in that: in the package apparatus 3B, the second surface 234B of the second conductive pillar layer 230B is positioned coplanar with the second molding compound layer 220B; in the package apparatus 3C, the second surface 234B of the second conductive pillar layer 230B is higher than the second molding compound layer 220B; in the package apparatus 3D, although the second surface 234B of the second conductive pillar layer 230B is lower than the second molding compound layer 220B, the second molding compound layer 220B is formed covering all the lateral surface of the second surface 234B of the second conductive pillar layer 230B; in the package apparatus 3E, the second surface 234B of the second conductive pillar layer 230B is positioned coplanar with the second molding compound layer 220B, while allowing the second molding compound layer 220B to be formed covering all the lateral surface of the second surface 234B of the second conductive pillar layer 230B; and in the package apparatus 3F, the second surface 234B of the second conductive pillar layer 230B is higher than the second molding compound layer 220B, while allowing the second molding compound layer 220B to be formed covering a specific portion of the lateral surface of the second surface 234B of the second conductive pillar layer 230B.

Figure 4A:
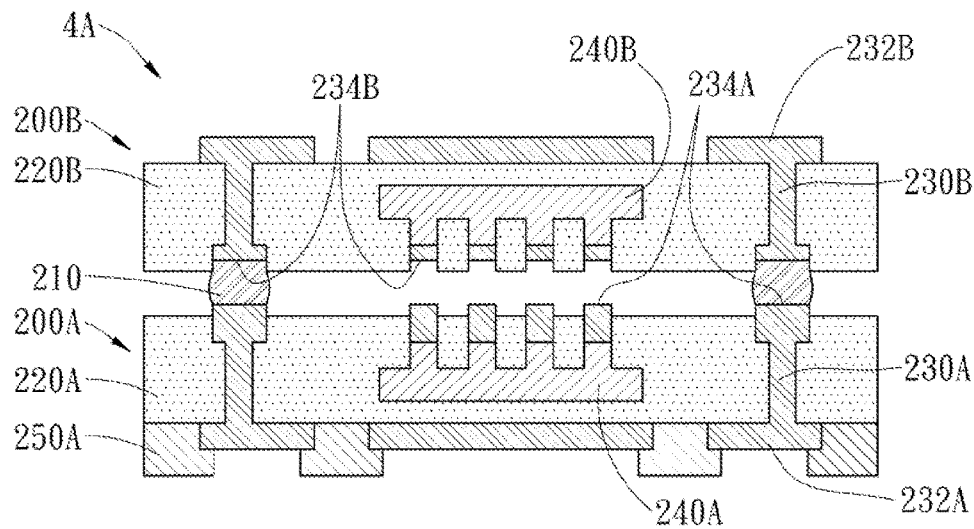
FIG. 4A is a schematic diagram showing a package apparatus according to a thirteenth embodiment of the present invention.
Figure 4B:
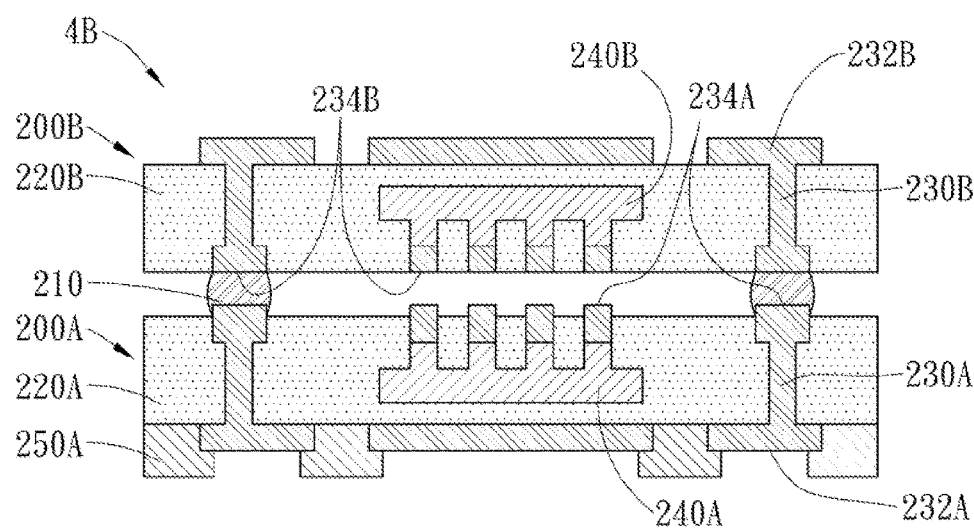
FIG. 4B is a schematic diagram showing a package apparatus according to a fourteenth embodiment of the present invention.
Figure 4C:
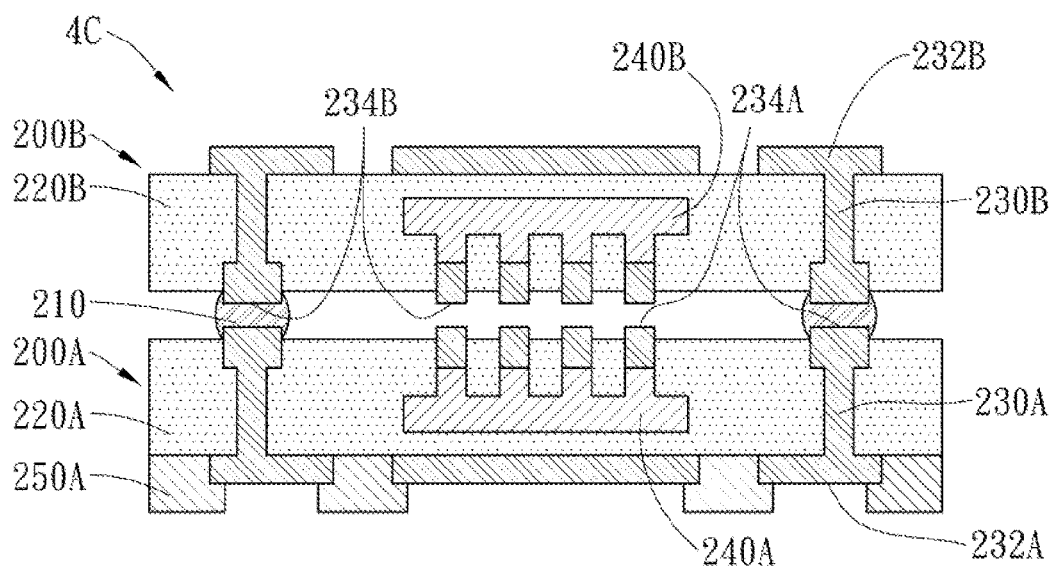
FIG. 4C is a schematic diagram showing a package apparatus according to a fifteenth embodiment of the present invention.
Figure 4D:
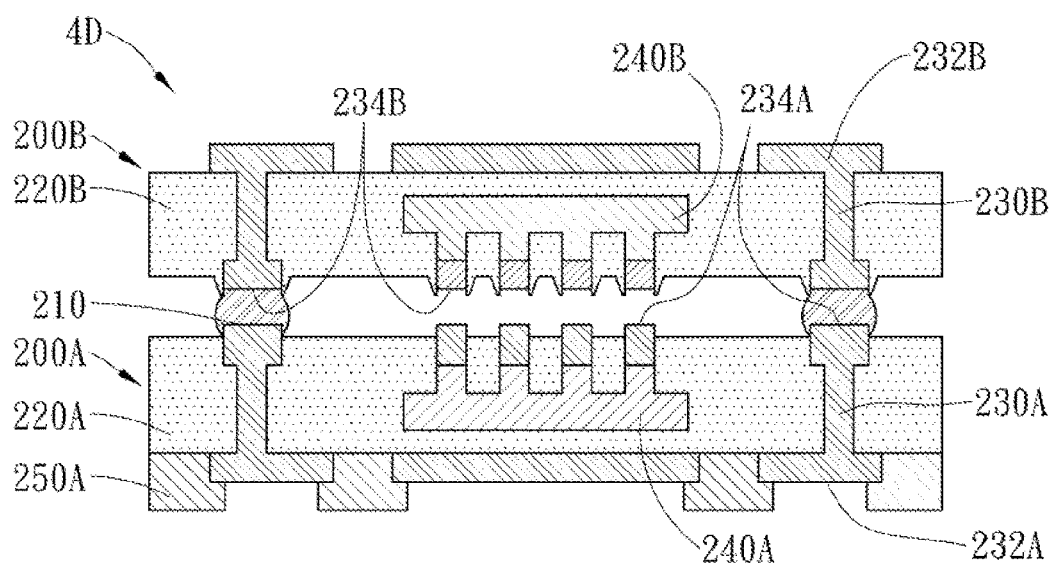
FIG. 4D is a schematic diagram showing a package apparatus according to a sixteenth embodiment of the present invention.
Figure 4E:
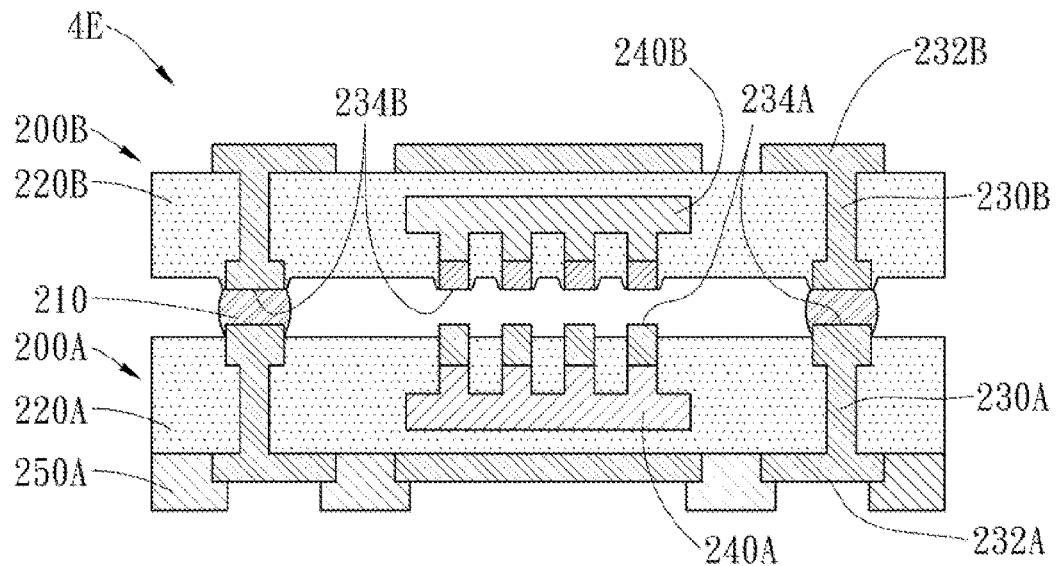
FIG. 4E is a schematic diagram showing a package apparatus according to a seventeenth embodiment of the present invention.
Figure 4F:
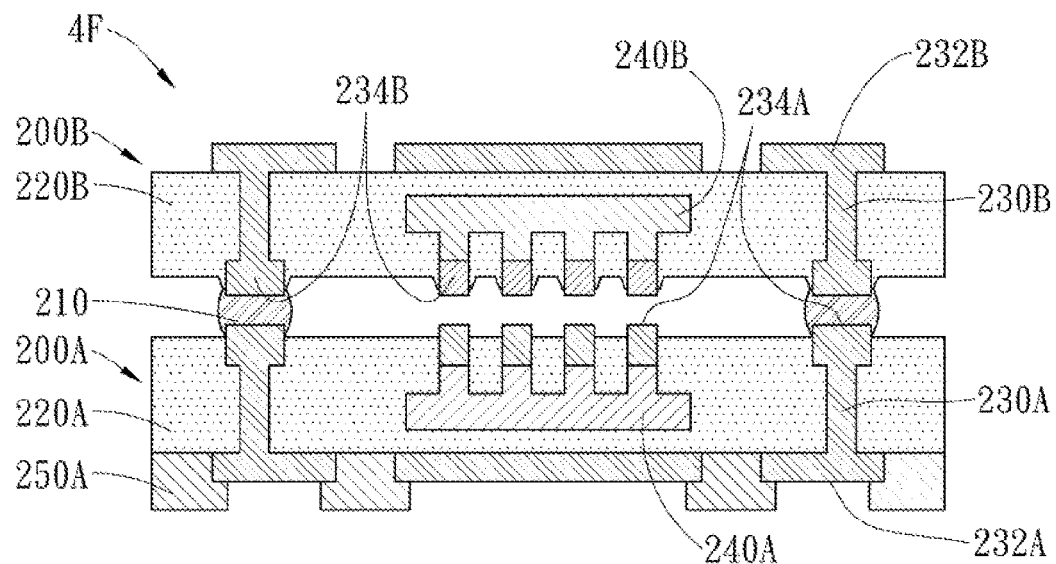
FIG. 4F is a schematic diagram showing a package apparatus according to an eighteenth embodiment of the present invention.

Please refer to FIG. 4A, which is a schematic diagram showing a package apparatus according to a thirteenth embodiment of the present invention. The package apparatus 4A of this thirteenth embodiment is structured similar to the package apparatus 2A of the first embodiment, but is different in that: in the package apparatus 4A, the second surface 234A of the first conductive pillar layer 230A is higher than the first molding compound layer 220A, despite that the second surface 234B of the second conductive pillar layer 230B is lower than the second molding compound layer 220B, but it is not limited thereby.

Please refer to FIG. 4B to FIG. 4F, which are schematic diagrams respectively showing a package apparatus according to a fourteenth embodiment to an eighteenth embodiment of the present invention. Each of the package apparatuses 4B to 4F of these embodiments is structured similar to the package apparatus 4A of the thirteenth embodiment, that is, the second surface 234A of the first conductive pillar layer 230A is higher than the first molding compound layer 220A, but it is different in that: in the package apparatus 4B, the second surface 234B of the second conductive pillar layer 230B is positioned coplanar with the second molding compound layer 220B; in the package apparatus 4C, the second surface 234B of the second conductive pillar layer 230B is higher than the second molding compound layer 220B; in the package apparatus 4C, the second surface 234B of the second conductive pillar layer 230B is lower than the second molding compound layer 220B, while allowing the second molding compound layer 220B to be formed covering all the lateral surface of the second surface 234B of the second conductive pillar layer 230B; in the package apparatus 4E, the second surface 234B of the second conductive pillar layer 230B is positioned coplanar with the second molding compound layer 220B, while allowing the second molding compound layer 220B to be formed covering all the lateral surface of the second surface 234B of the second conductive pillar layer 230B; and in the package apparatus 4F, the second surface 234B of the second conductive pillar layer 230B is higher than the second molding compound layer 220B, while allowing the second molding compound layer 220B to be formed covering a specific portion of the lateral surface of the second surface 234B of the second conductive pillar layer 230B.

Figure 5A:
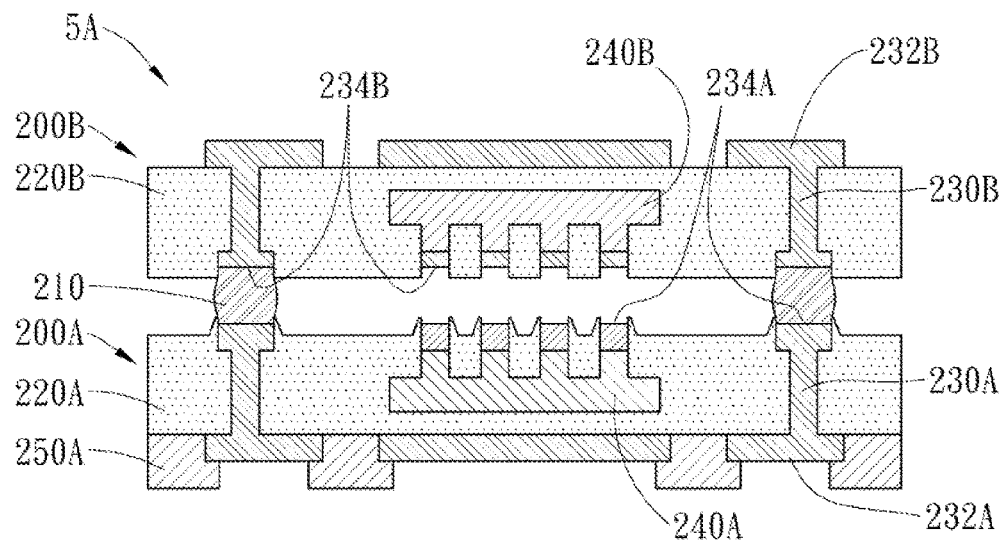
FIG. 5A is a schematic diagram showing a package apparatus according to a nineteenth embodiment of the present invention.
Figure 5B:
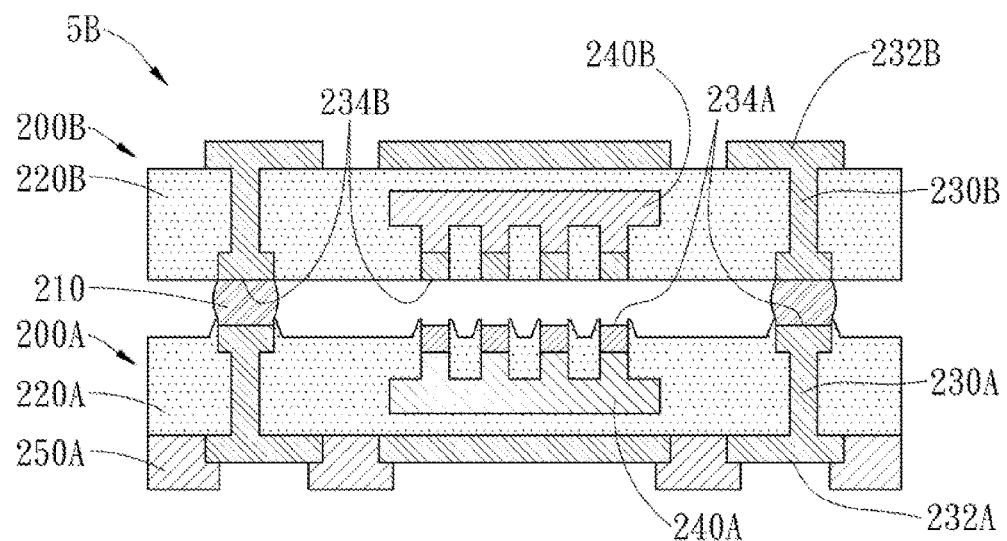
FIG. 5B is a schematic diagram showing a package apparatus according to a twentieth embodiment of the present invention.
Figure 5C:
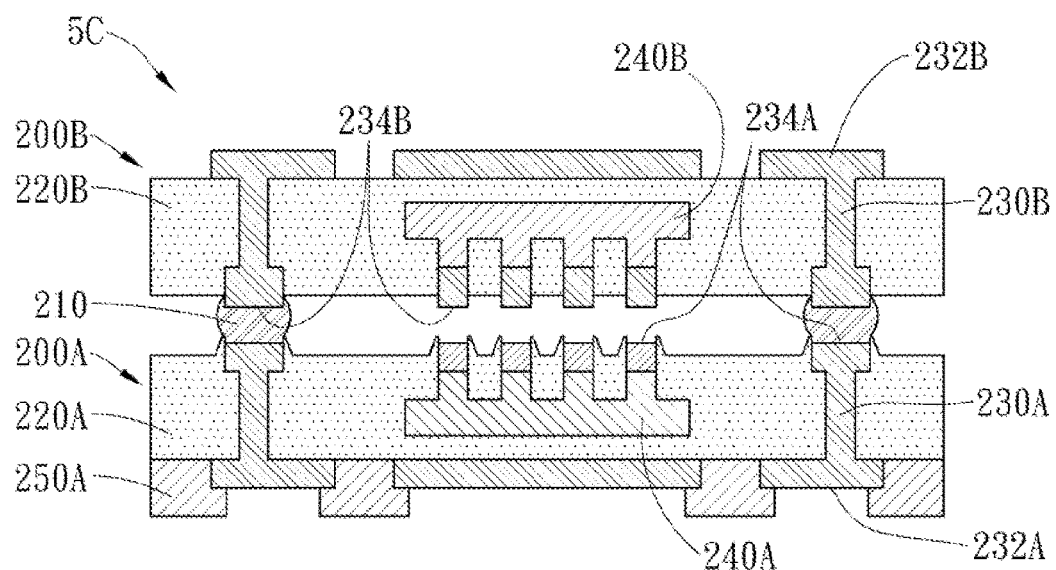
FIG. 5C is a schematic diagram showing a package apparatus according to a twenty-first embodiment of the present invention.
Figure 5D:
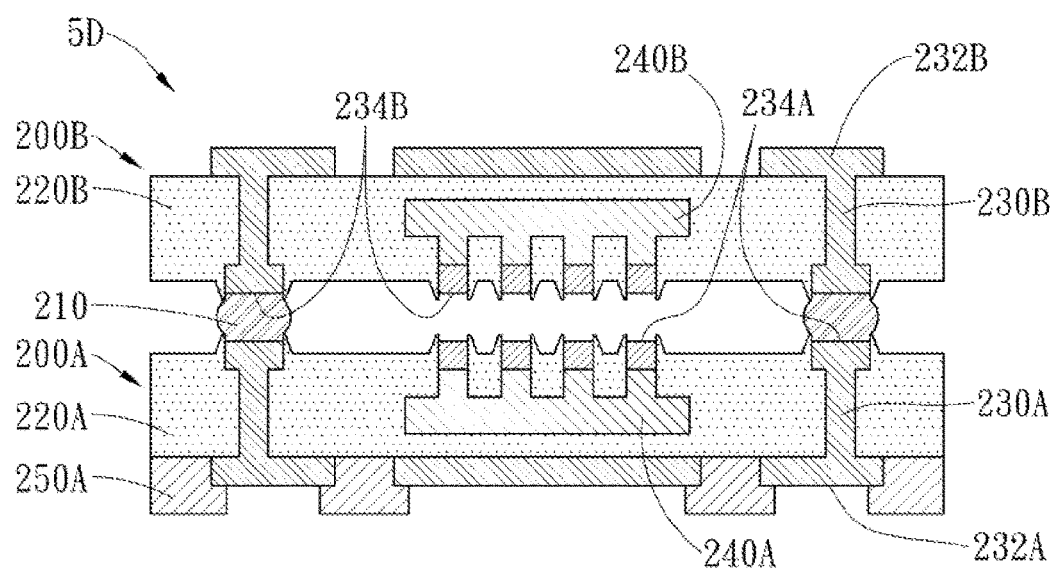
FIG. 5D is a schematic diagram showing a package apparatus according to a twenty-second embodiment of the present invention.
Figure 5E:
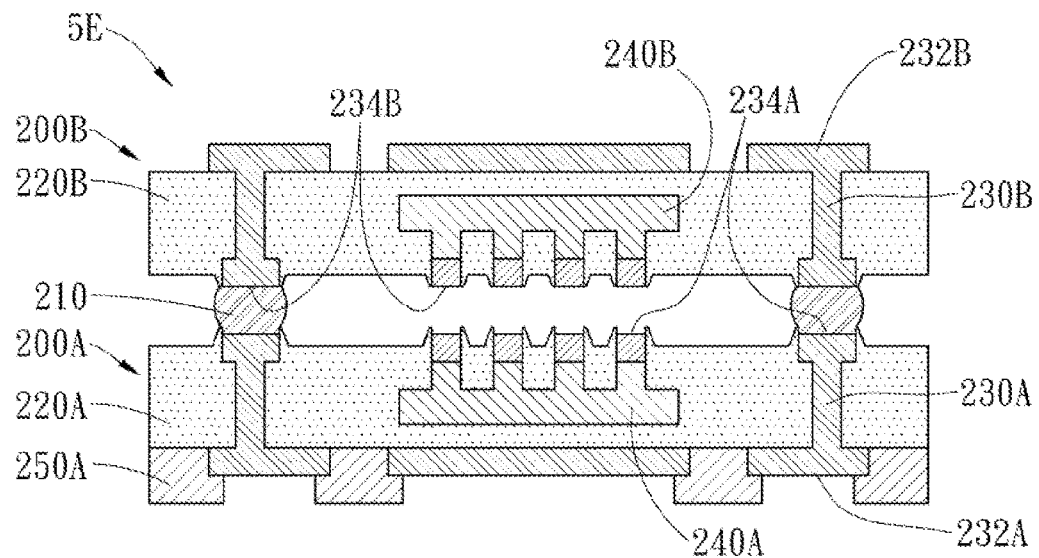
FIG. 5E is a schematic diagram showing a package apparatus according to a twenty-third embodiment of the present invention.
Figure 5F:
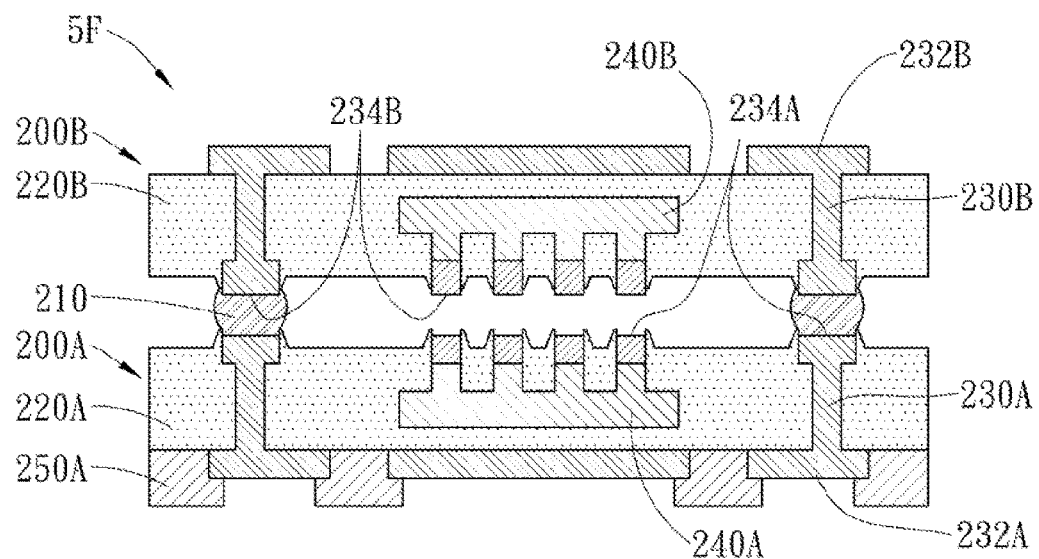
FIG. 5F is a schematic diagram showing a package apparatus according to a twenty-fourth embodiment of the present invention.

Please refer to FIG. 5A, which is a schematic diagram showing a package apparatus according to a nineteenth embodiment of the present invention. The package apparatus 5A of this nineteenth embodiment is structured similar to the package apparatus 2A of the first embodiment, but is different in that: in the package apparatus 5A, the second surface 234A of the first conductive pillar layer 230A is lower than the first molding compound layer 220A while allowing the first molding compound layer 220A to be formed covering all the lateral surface of the second surface 234A of the first conductive pillar layer 230A, despite that the second surface 234B of the second conductive pillar layer 230B is lower than the second molding compound layer 220B, but it is not limited thereby.

Please refer to FIG. 5B to FIG. 5F, which are schematic diagrams respectively showing a package apparatus according to a twentieth embodiment to a twenty-third embodiment of the present invention. Each of the package apparatuses 5B to 5F of these embodiments is structured similar to the package apparatus 5A of the nineteenth embodiment, but is different in that: in the package apparatus 5B, the second surface 234B of the second conductive pillar layer 230B is positioned coplanar with the second molding compound layer 220B; in the package apparatus 5C, the second surface 234B of the second conductive pillar layer 230B is higher than the second molding compound layer 220B; in the package apparatus 5D, the second molding compound layer 220B is formed covering all the lateral surface of the second surface 234B of the second conductive pillar layer 230B, despite that the second surface 234B of the second conductive pillar layer 230B is lower than the second molding compound layer 220B; in the package apparatus 5E, the second surface 234B of the second conductive pillar layer 230B is positioned coplanar with the second molding compound layer 220B while allowing the second molding compound layer 220B to be formed covering all the lateral surface of the second surface 234B of the second conductive pillar layer 230B; and in the package apparatus 5F, the second surface 234B of the second conductive pillar layer 230B is higher than the second molding compound layer 220B while allowing the second molding compound layer 220B to be formed covering a specific portion of the lateral surface of the second surface 234B of the second conductive pillar layer 230B.

Figure 6A:
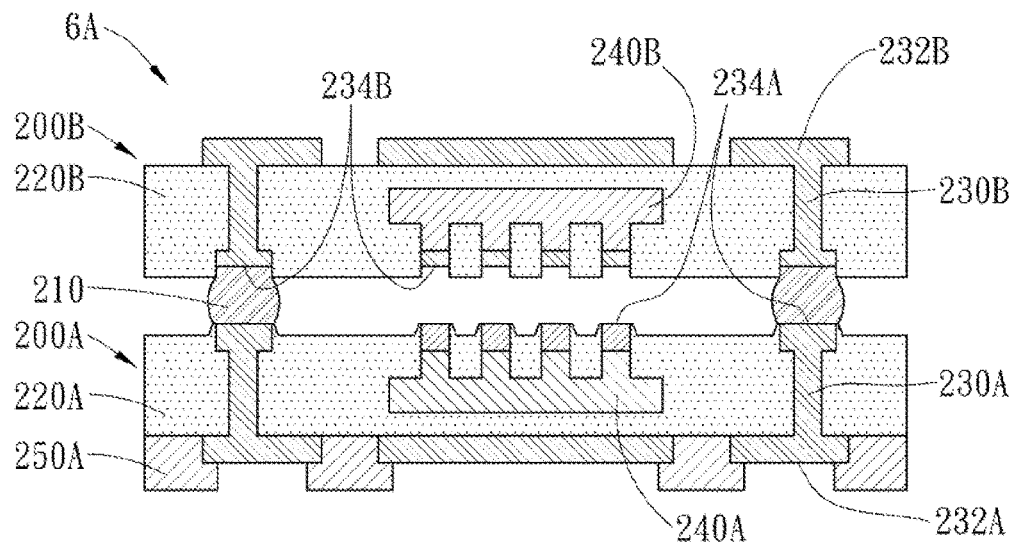
FIG. 6A is a schematic diagram showing a package apparatus according to a twenty-fifth embodiment of the present invention.
Figure 6B:
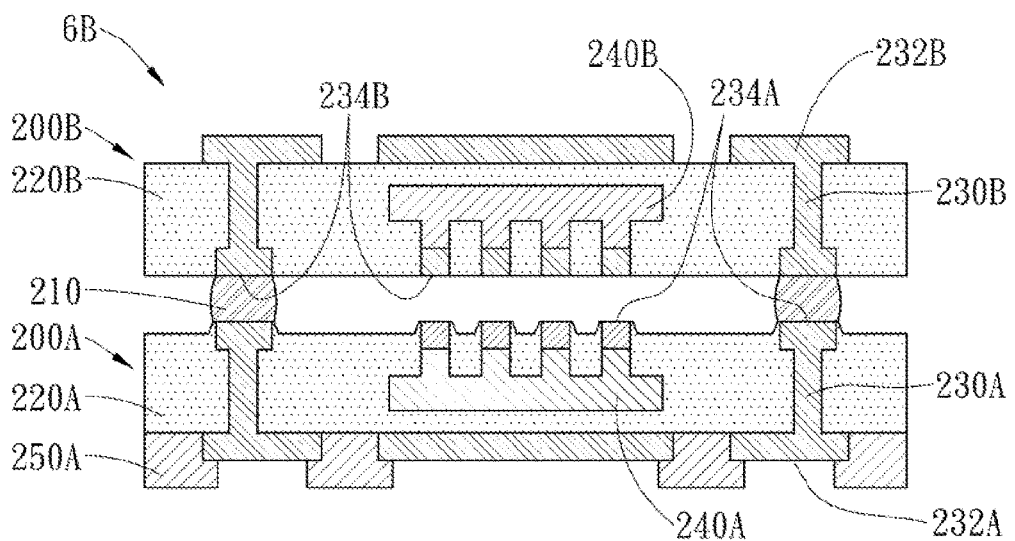
FIG. 6B is a schematic diagram showing a package apparatus according to a twenty-sixth embodiment of the present invention.
Figure 6C:
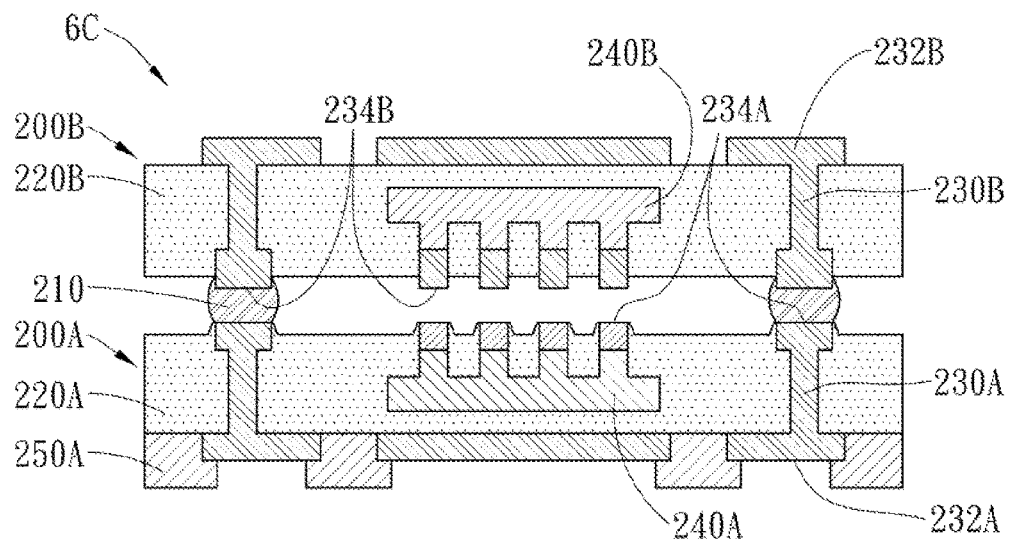
FIG. 6C is a schematic diagram showing a package apparatus according to a twenty-seventh embodiment of the present invention.
Figure 6D:
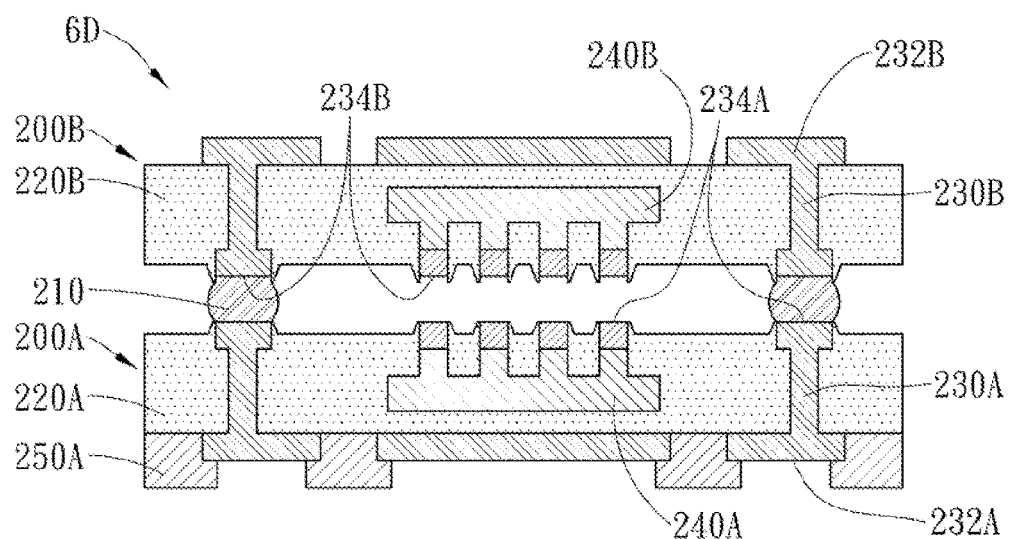
FIG. 6D is a schematic diagram showing a package apparatus according to a twenty-eighth embodiment of the present invention.
Figure 6E:
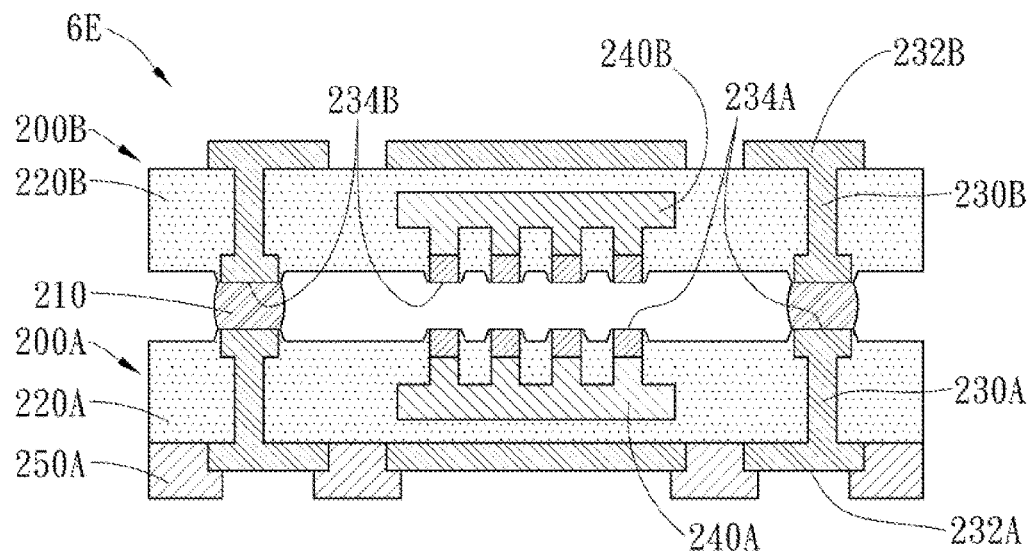
FIG. 6E is a schematic diagram showing a package apparatus according to a twenty-ninth embodiment of the present invention.
Figure 6F:
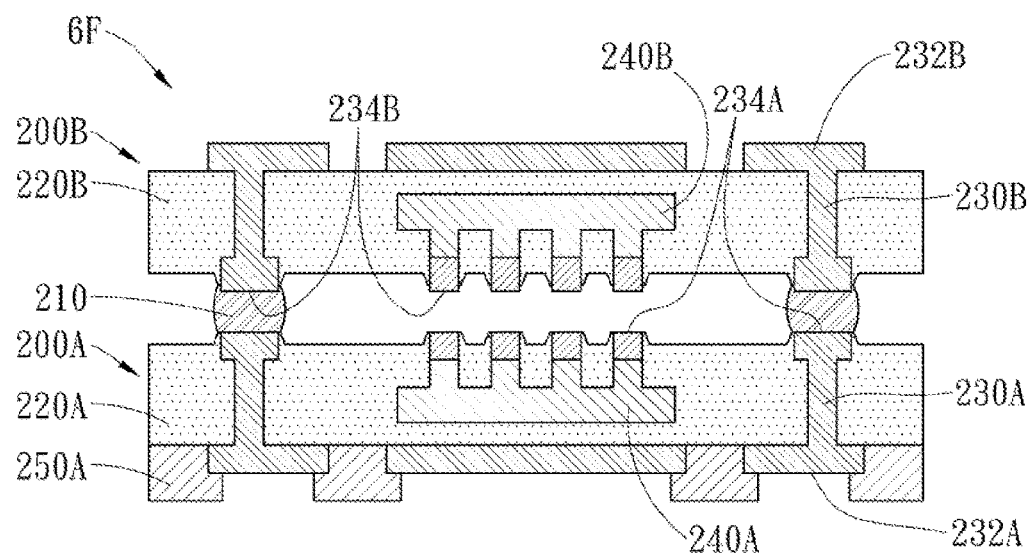
FIG. 6F is a schematic diagram showing a package apparatus according to a thirtieth embodiment of the present invention.

Please refer to FIG. 6A, which is a schematic diagram showing a package apparatus according to a twenty-fifth embodiment of the present invention. The package apparatus 6A of this twenty-fifth embodiment is structured similar to the package apparatus 2A of the first embodiment, but is different in that: in the package apparatus 6A, the second surface 234A of the first conductive pillar layer 230A is positioned coplanar with the first molding compound layer 220A while allowing the first molding compound layer 220A to be formed covering all the lateral surface of the second surface 234A of the first conductive pillar layer 230A, despite that the second surface 234B of the second conductive pillar layer 230B is lower than the second molding compound layer 220B, but it is not limited thereby.

Please refer to FIG. 6B to FIG. 6F, which are schematic diagrams respectively showing a package apparatus according to a twenty-sixth embodiment to thirtieth embodiment of the present invention. Each of the package apparatuses 6B to 6F of these embodiments is structured similar to the package apparatus 6A of the twenty-fifth embodiment, that is, the second surface 234A of the first conductive pillar layer 230A is positioned coplanar with the first molding compound layer 220A while allowing the first molding compound layer 220A to be formed covering all the lateral surface of the second surface 234A of the first conductive pillar layer 230A, but is different in that: in the package apparatus 6B, the second surface 234B of the second conductive pillar layer 230B is positioned coplanar with the second molding compound layer 220B; in the package apparatus 6C, the second surface 234B of the second conductive pillar layer 230B is higher than the second molding compound layer 220B; in the package apparatus 6D, the second surface 234B of the second conductive pillar layer 230B is lower than the second molding compound layer 220B, while allowing the second molding compound layer 220B to be formed covering all the lateral surface of the second surface 234B of the second conductive pillar layer 230B; in the package apparatus 6E, the second surface 234B of the second conductive pillar layer 230B is positioned coplanar with the second molding compound layer 220B, while allowing the second molding compound layer 220B to be formed covering all the lateral surface of the second surface 234B of the second conductive pillar layer 230B; and in the package apparatus 6F, the second surface 234B of the second conductive pillar layer 230B is higher than the second molding compound layer 220B, while allowing the second molding compound layer 220B to be formed covering a specific portion of the lateral surface of the second surface 234B of the second conductive pillar layer 230B.

Figure 7A:
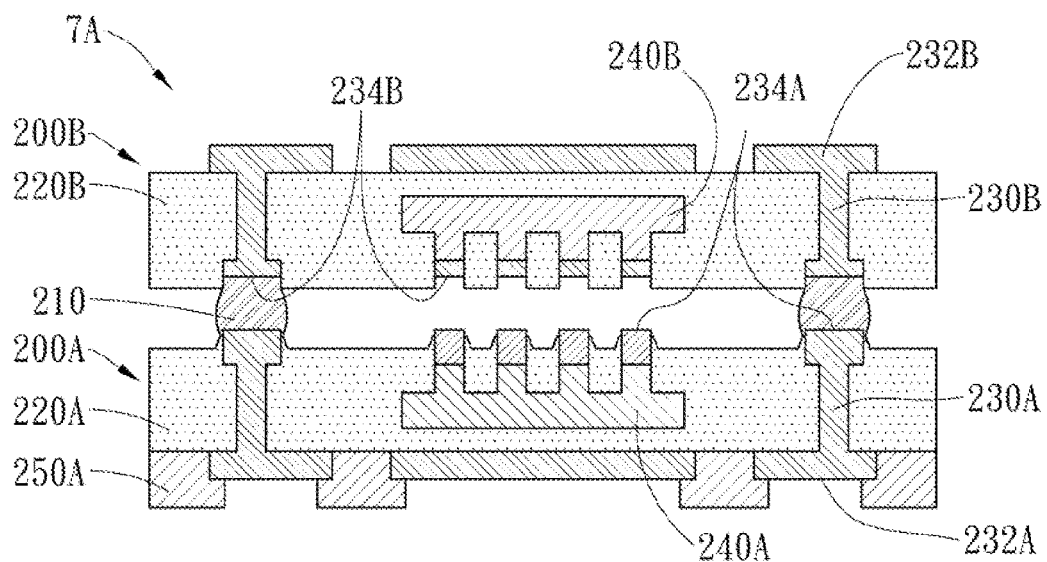
FIG. 7A is a schematic diagram showing a package apparatus according to a thirty-first embodiment of the present invention.
Figure 7B:
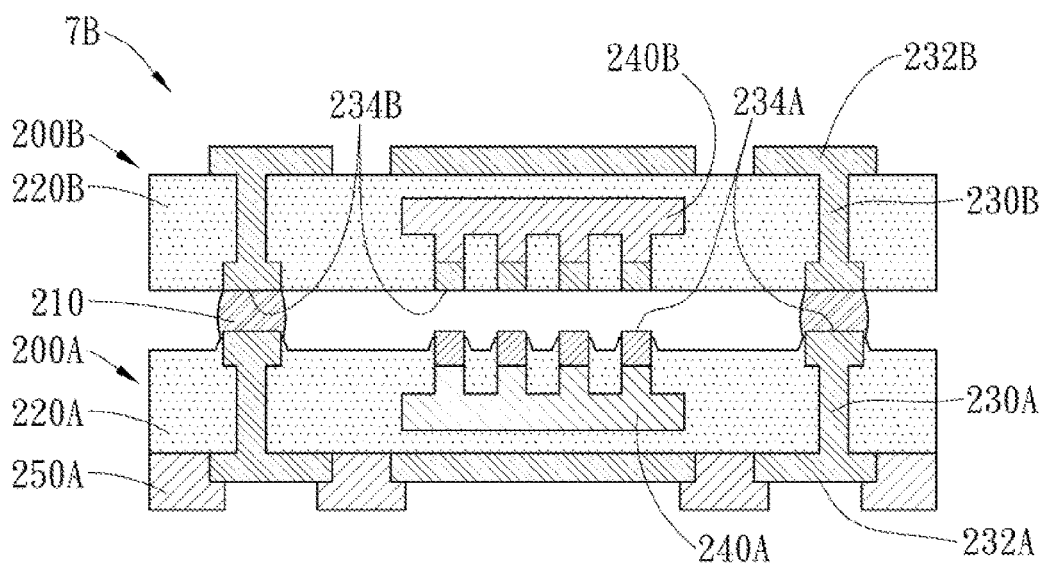
FIG. 7B is a schematic diagram showing a package apparatus according to a thirty-second embodiment of the present invention.
Figure 7C:
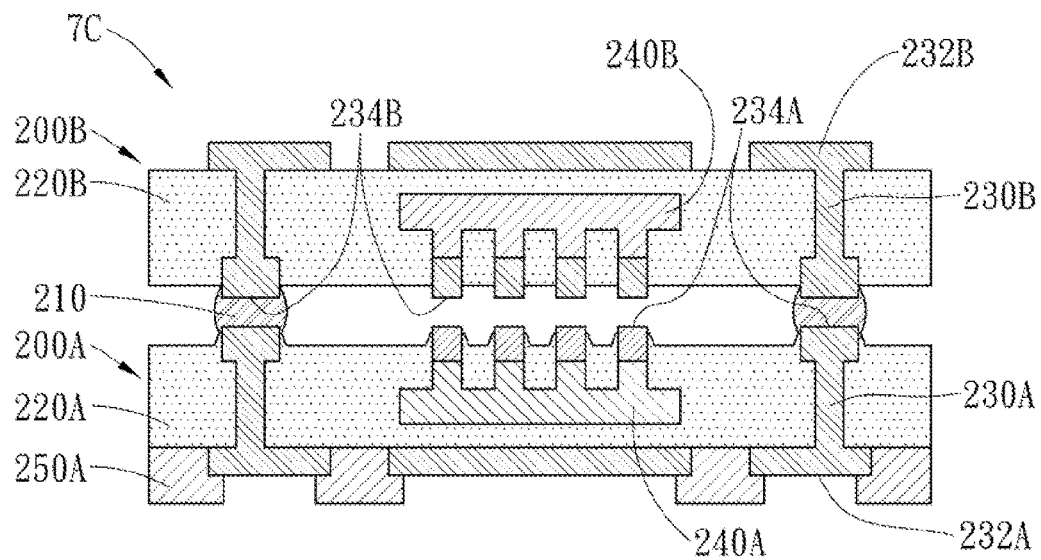
FIG. 7C is a schematic diagram showing a package apparatus according to a thirty-third embodiment of the present invention.
Figure 7D:
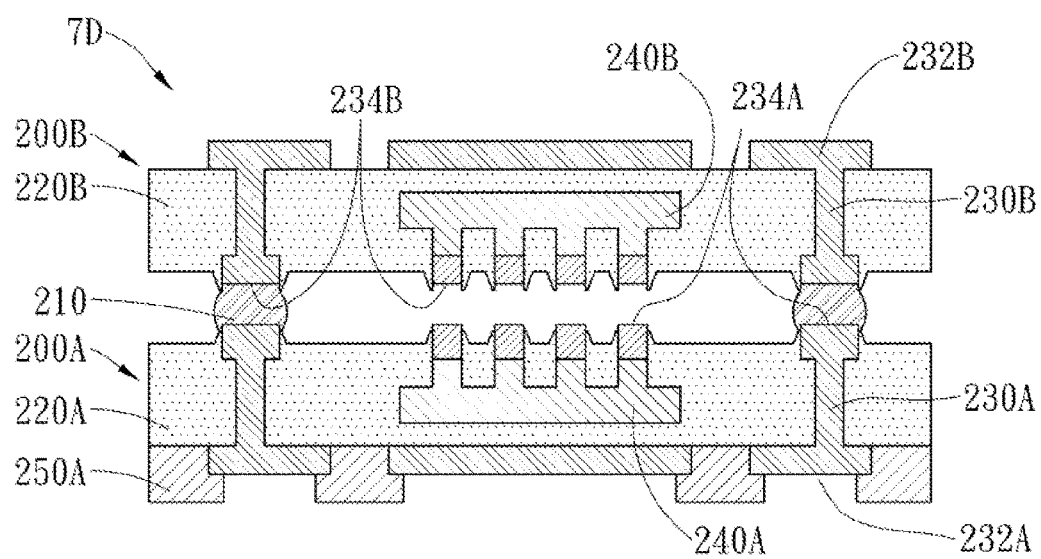
FIG. 7D is a schematic diagram showing a package apparatus according to a thirty-fourth embodiment of the present invention.
Figure 7E:
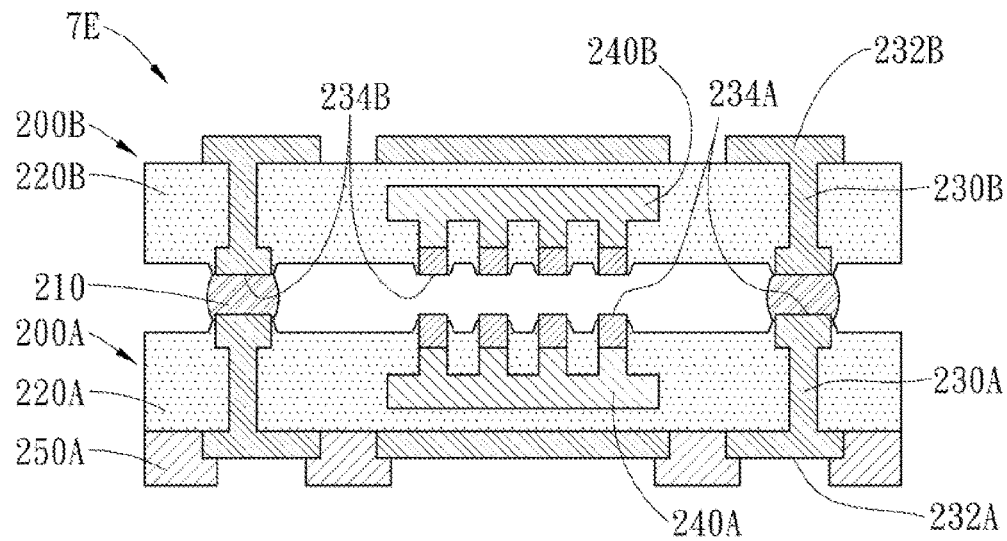
FIG. 7E is a schematic diagram showing a package apparatus according to a thirty-fifth embodiment of the present invention.
Figure 7F:
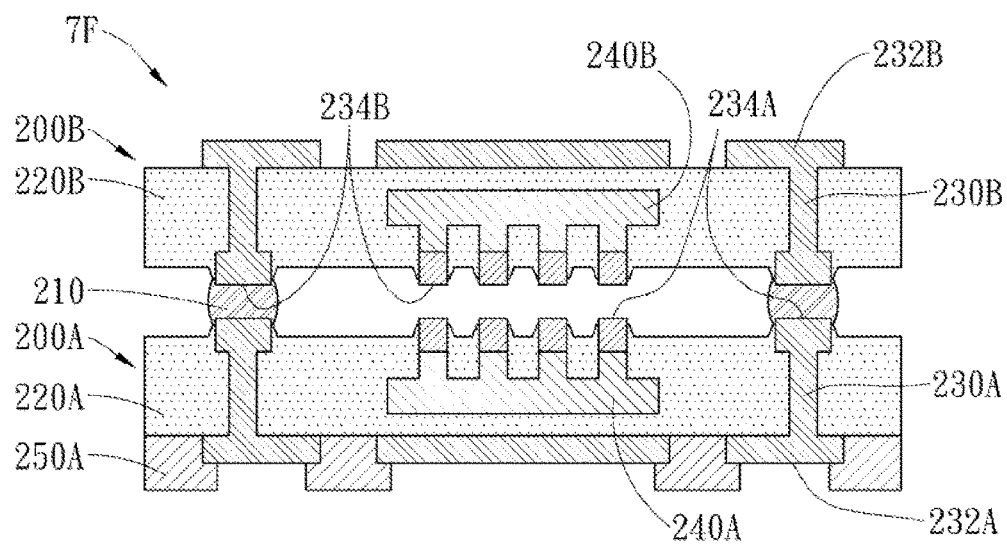
FIG. 7F is a schematic diagram showing a package apparatus according to a thirty-sixth embodiment of the present invention.

Please refer to FIG. 7A, which is a schematic diagram showing a package apparatus according to a thirty-first embodiment of the present invention. The package apparatus 7A of this thirty-first embodiment is structured similar to the package apparatus 2A of the first embodiment, but is different in that: in the package apparatus 7A, the second surface 234A of the first conductive pillar layer 230A is higher than the first molding compound layer 220A while allowing the first molding compound layer 220A to be formed covering all the lateral surface of the second surface 234A of the first conductive pillar layer 230A, despite that the second surface 234B of the second conductive pillar layer 230B is lower than the second molding compound layer 220B, but it is not limited thereby.

Please refer to FIG. 7B to FIG. 7F, which are schematic diagrams respectively showing a package apparatus according to a thirty-second embodiment to a thirty-sixth embodiment of the present invention. Each of the package apparatuses 7B to 7F of these embodiments is structured similar to the package apparatus 7A of the thirty-first embodiment, that is, the second surface 234A of the first conductive pillar layer 230A is higher than the first molding compound layer 220A while allowing the first molding compound layer 220A to be formed covering all the lateral surface of the second surface 234A of the first conductive pillar layer 230A, but is different in that: in the package apparatus 7B, the second surface 234B of the second conductive pillar layer 230B is positioned coplanar with the second molding compound layer 220B; in the package apparatus 7C, the second surface 234B of the second conductive pillar layer 230B is higher than the second molding compound layer 220B; in the package apparatus 7D, the second surface 234B of the second conductive pillar layer 230B is lower than the second molding compound layer 220B, while allowing the second molding compound layer 220B to be formed covering all the lateral surface of the second surface 234B of the second conductive pillar layer 230B; in the package apparatus 7E, the second surface 234B of the second conductive pillar layer 230B is positioned coplanar with the second molding compound layer 220B, while allowing the second molding compound layer 220B to be formed covering all the lateral surface of the second surface 234B of the second conductive pillar layer 230B; and in the package apparatus 7F, the second surface 234B of the second conductive pillar layer 230B is higher than the second molding compound layer 220B, while allowing the second molding compound layer 220B to be formed covering a specific portion of the lateral surface of the second surface 234B of the second conductive pillar layer 230B.

Figure 8A:
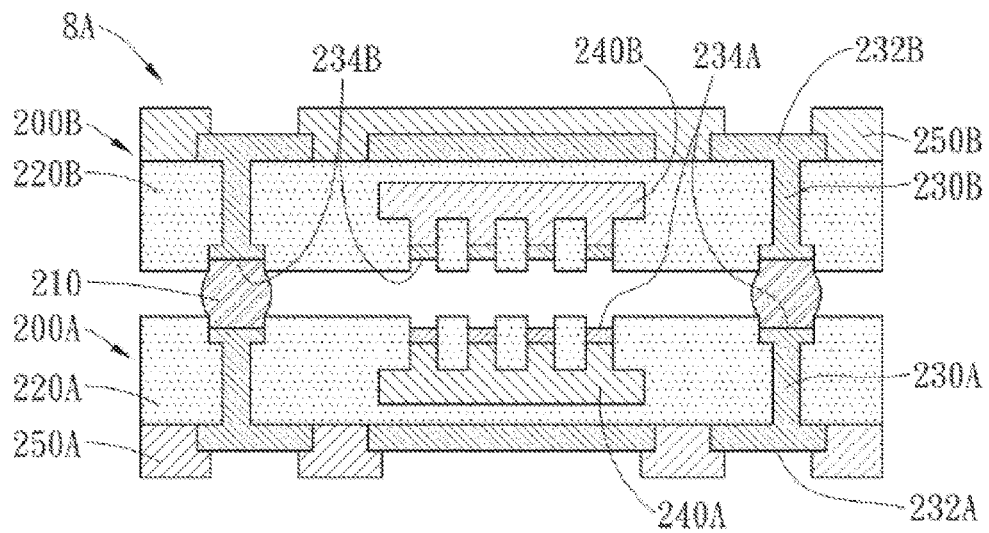
FIG. 8A is a schematic diagram showing a package apparatus according to a thirty-seventh embodiment of the present invention.

Please refer to FIG. 8A, which is a schematic diagram showing a package apparatus according to a thirty-seventh embodiment of the present invention. The package apparatus 8A of this thirty-seventh embodiment is structured similar to the package apparatus 2A of the first embodiment, but is different in that: in the package apparatus of FIG. 8A, the second package module 200B further comprises a second protection layer 250B that is disposed on the second molding compound layer 220B and the first surface 232B of the second conductive pillar layer 230B, but it is not limited thereby.

Figure 8B:
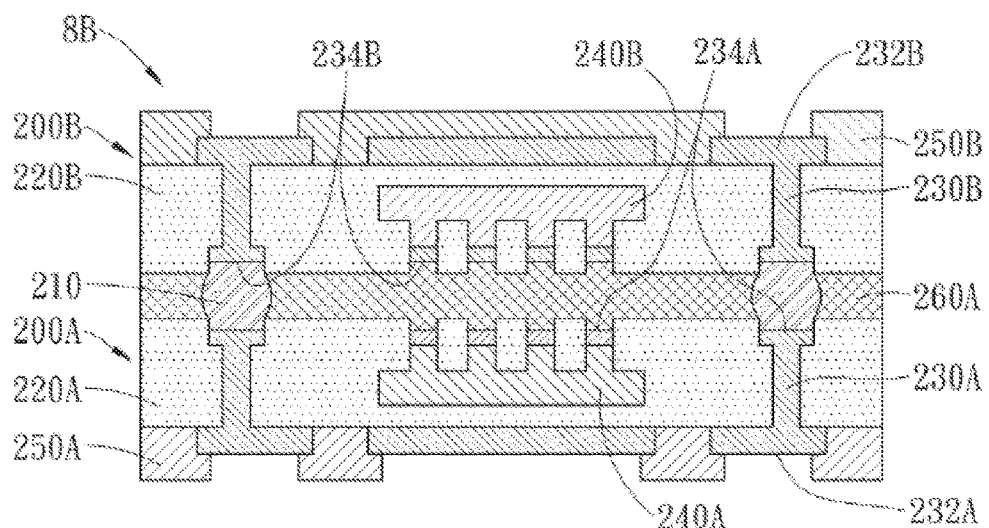
FIG. 8B is a schematic diagram showing a package apparatus according to a thirty-eighth embodiment of the present invention.

Please refer to FIG. 8B, which is a schematic diagram showing a package apparatus according to a thirty-eighth embodiment of the present invention. The package apparatus 8B of this thirty-eighth embodiment is structured similar to the package apparatus 8A of the thirty-seventh embodiment, but is different in that: in the package apparatus of FIG. 8B, the package apparatus 8B further comprises: a first adhesive layer 260A that is disposed at a position between the first molding compound layer 220A and the second molding compound layer 220B while allowing the plural conductive elements 210 to be disposed inside the first adhesive layer 260A, but it is not limited thereby.

Figure 9:
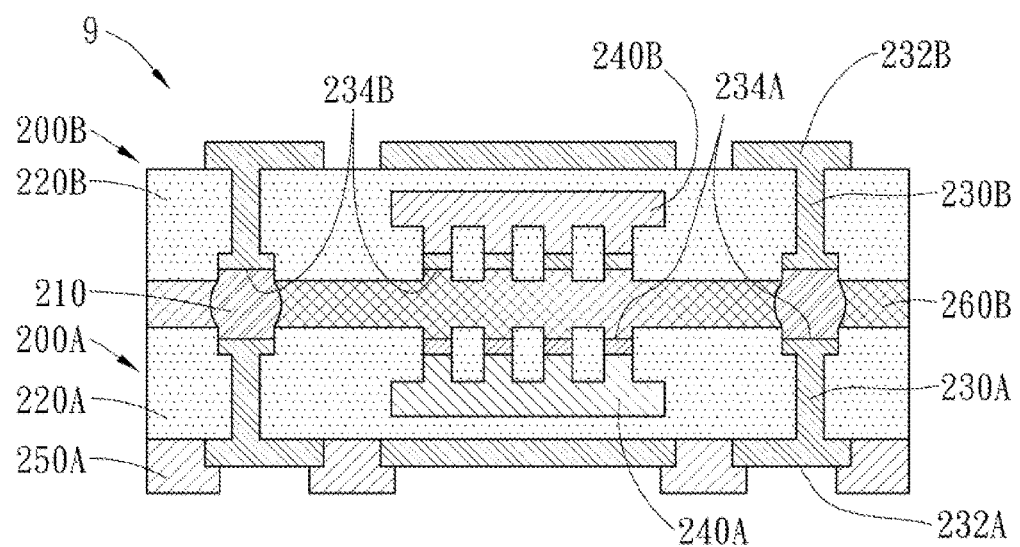
FIG. 9 is a schematic diagram showing a package apparatus according to a thirty-ninth embodiment of the present invention.

Please refer to FIG. 9, which is a schematic diagram showing a package apparatus according to a thirty-ninth embodiment of the present invention. The package apparatus 9 of this thirty-ninth embodiment is structured similar to the package apparatus 2A of the first embodiment, but is different in that: in the package apparatus of FIG. 9, the package apparatus 9 further comprises: a second adhesive layer 260B that is disposed at a position between the first molding compound layer 220A and the second molding compound layer 220B while allowing the plural conductive elements 210 to be disposed inside the second adhesive layer 260B, but it is not limited thereby.

Figure 10A:
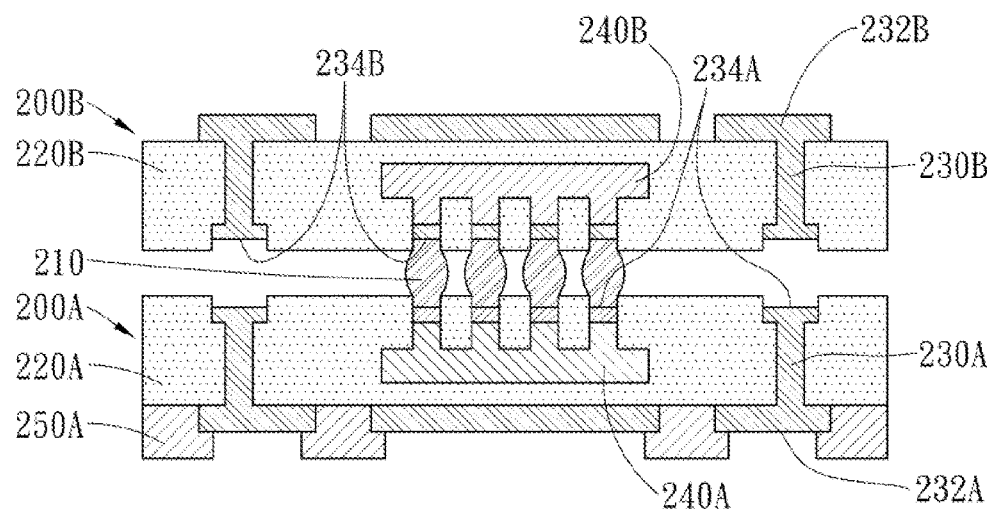
FIG. 10A is a schematic diagram illustrating the manufacturing of a package apparatus of the first embodiment.

Please refer to FIG. 10A, which is a schematic diagram illustrating the manufacturing of a package apparatus of the first embodiment. In FIG. 10A, the plural conductive elements 210 are only being disposed inside an area enclosed and defined by the first internal component 240A and the second internal component 240B while being positioned between the second surface 234A of the first conductive pillar layer 230A and the second surface 234B of the second conductive pillar layer 230B. That is, the electrical connection between the first package module 200A and the second package module 200B is achieved only by the electrical connection of the first internal component 240A and the second internal component 240B.

Figure 10B:
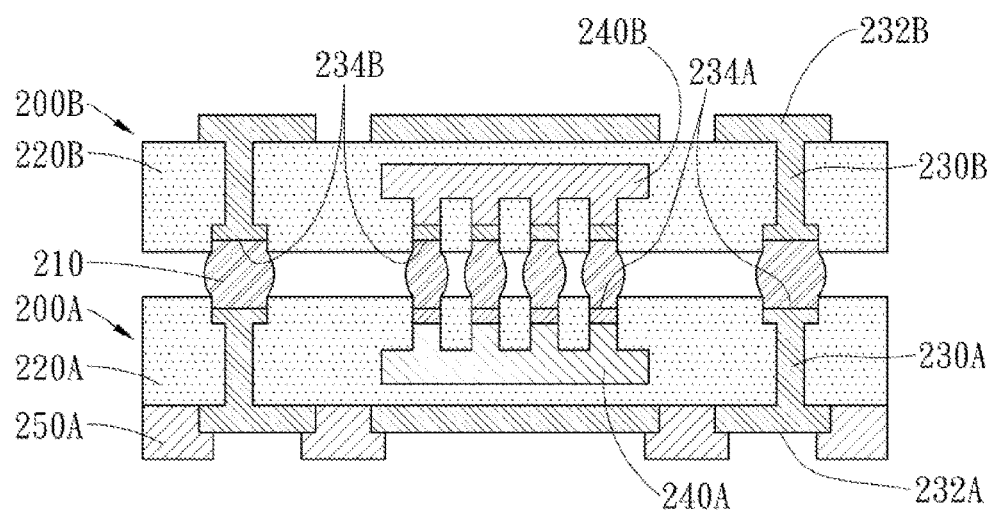
FIG. 10B is a schematic diagram illustrating another manufacturing of a package apparatus of the first embodiment.

Please refer to FIG. 10B, which is a schematic diagram illustrating another manufacturing of a package apparatus of the first embodiment. In FIG. 10B, the plural conductive elements 210 are disposed and sandwiched between the second surface 234A of the first conductive pillar layer 230A of the first package module 200A and the second surface 234B of the second conductive pillar layer 230B of the second package module 200B.

Notably, the aforesaid package apparatuses shown in FIG. 2B to FIG. 9 can be formed in the same as those disclosed in FIG. 10A and FIG. 10B, are thus will not be described further herein.

Figure 10C:
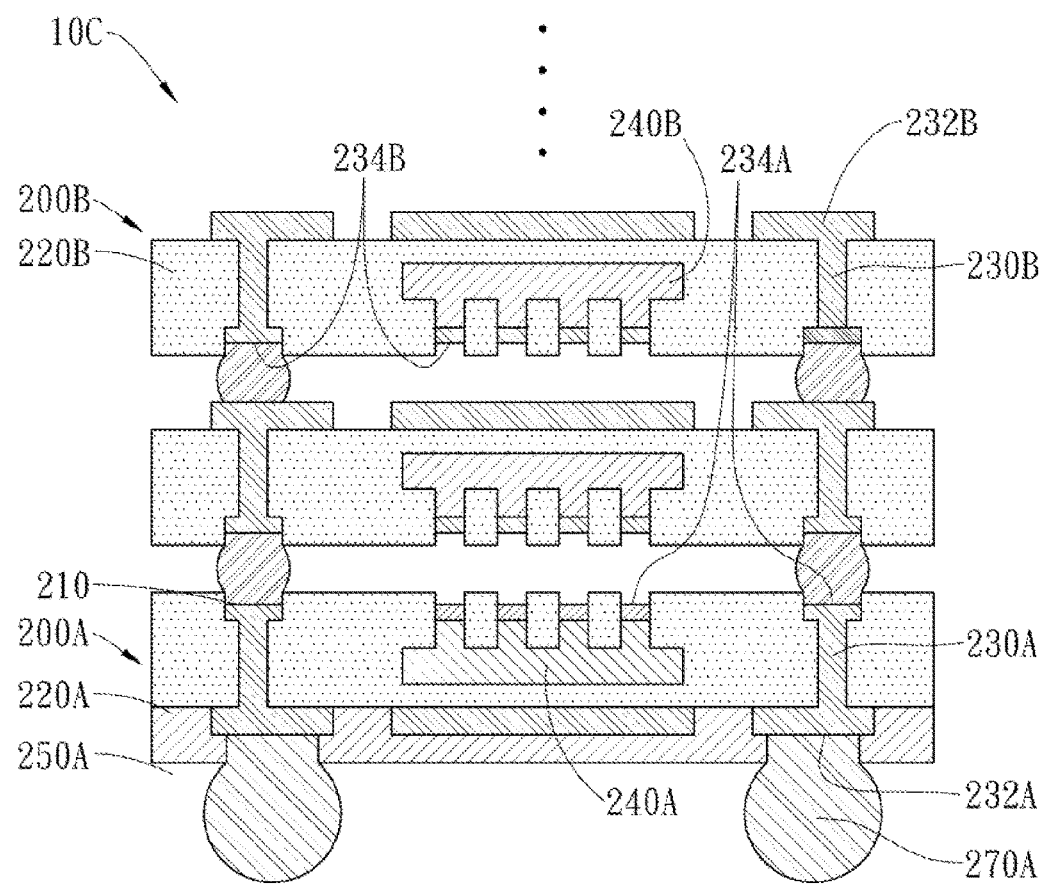
FIG. 10C is a schematic diagram illustrating a package apparatus with multi-layered metal laminated structure according to the first embodiment.

Please refer to FIG. 10C, which is a schematic diagram illustrating a package apparatus with multi-layered metal laminated structure according to the first embodiment. The package apparatus with multi-layered metal laminated structure 10C is substantially a package apparatus 2A that is formed with a plurality of the second package modules 200B, a plurality of conductive elements and a plurality of solder balls 270A. The solder balls 270A are disposed electrically connected to the first surface 232A of the first conductive pillar layer 230A. Each of the plural second package modules 200B, excepting the one that is disposed in front of the other second package modules 200B, are packaged and electrically connecting to the first surface 232B of the second conductive pillar layer 230B of the other second package module 200B that is being disposed in front of the referring second package module 200B by the conductive elements 210, but it is not limited thereby. Notably, the aforesaid package apparatuses shown in FIG. 2B to FIG. 9 can be formed in the same as that disclosed in FIG. 10C, are thus will not be described further herein.

Please refer to FIG. 11, which is a flow chart depicting steps performing in a method for manufacturing a package apparatus of the first embodiment. The method comprises the following steps:

step S1102: providing a first package module 200A while enabling the first package module 200A to be comprised of: a first molding compound layer 220A; a first conductive pillar layer 230A, formed with a first surface 232A and a second surface 234A that are arranged opposite to the each other while being disposed in the first molding compound layer 220A; a first internal component 240A, electrically connected to the first conductive pillar layer 230A while being disposed in the first molding compound layer 220A; and a first protection layer, disposed on the first molding compound layer and the first surface of the first conductive pillar layer; whereas, the first conductive pillar layer 230A can be formed by the use of an electrolytic plating process, an electroless plating process, a sputtering coating process, or a thermal coating process, but is not limited thereby, and moreover, each of the first surface 232A and the second surface 234A of the first conductive pillar layer 230A can be a wiring layer with patterns which includes at least one wire or at least one chip seat, and can be made of a metal, such as copper; in addition, in this embodiment, the first molding compound layer 220A is formed by a process selected from the group consisting of: a transfer molding process, a top molding process, a compression molding process, an injection molding process and a vacuum casting molding process, and can be made from a material selected from the group consisting of novolac-based resin, epoxy-based resin, silicon-based resin and other molding compounds, whichever can be heated to a liquid state so as to be poured on the first conductive pillar layer 230A for allowing the same to cover all or a portion of the first conductive pillar layer 230A, under a high-temperature and high-pressure condition, and thereafter, to be cured into the first molding compound layer 220A, and moreover the first molding compound layer 220A can be composed of a kind of filler, such as a power silicon dioxide; and correspondingly in another embodiment, the formation of the first molding compound layer 220A can include the steps of: providing a molding compound to be heated to a liquid state, whereas the molding compound is composed of a resin and power silicon dioxide; pouring the liquefied molding compound on a metal carrier while allowing the molding compound to cover all or a portion of the first conductive pillar layer 230A under a high-temperature and high-pressure condition; and curing the molding compound for enabling the same to form the first molding compound layer 220A, but is not limited thereby;

step S1104: providing a second package module 200B while enabling the second package module 200B to be comprised of: a second molding compound layer 220B; a second conductive pillar layer 230B, formed with a first surface 232B and a second surface 234B that are arranged opposite to the each other while being disposed in the second molding compound layer 220B; and a second internal component 240B, electrically connected to the second conductive pillar layer 230B while being disposed in the second molding compound layer 220B; whereas, the second conductive pillar layer 230B can be formed in a way similar to that of the first conductive pillar layer 230A, but is not limited thereby, and moreover, each of the first surface 232B and the second surface 234B of the second conductive pillar layer 230B can be a wiring layer with patterns which includes at least one wire or at least one chip seat, and can be made of a metal, such as copper; in addition, in this embodiment, the second molding compound layer 220B is formed in a way similar to that of the first molding compound layer 220A, and can be made from a material similar to that of the first molding compound layer 220A; and correspondingly in another embodiment, the formation of the second molding compound layer 220B can include the steps of: providing a molding compound to be heated to a liquid state, whereas the molding compound is composed of a resin and power silicon dioxide; pouring the liquefied molding compound on a metal carrier while allowing the molding compound to cover all or a portion of the second conductive pillar layer 230B under a high-temperature and high-pressure condition; and curing the molding compound for enabling the same to form the second molding compound layer 220B, but is not limited thereby;

step S1106: providing a plurality of conductive elements 210 to be disposed between the second surface 234A of the first conductive pillar layer 230A of the first package module 200A and the second surface 234B of the second conductive pillar layer 230B of the second package module 200B, whereas each of the conductive elements 210 can be made of a metal, such as copper; and in an embodiment, the second surface 234A of the first conductive pillar layer 230A as well as the second surface 234B of the second conductive pillar layer 230B can be etched into an arc-shaped concave surface so as to effectively fixing the plural conductive elements 210, but is not limited thereby.

Figure 12A:
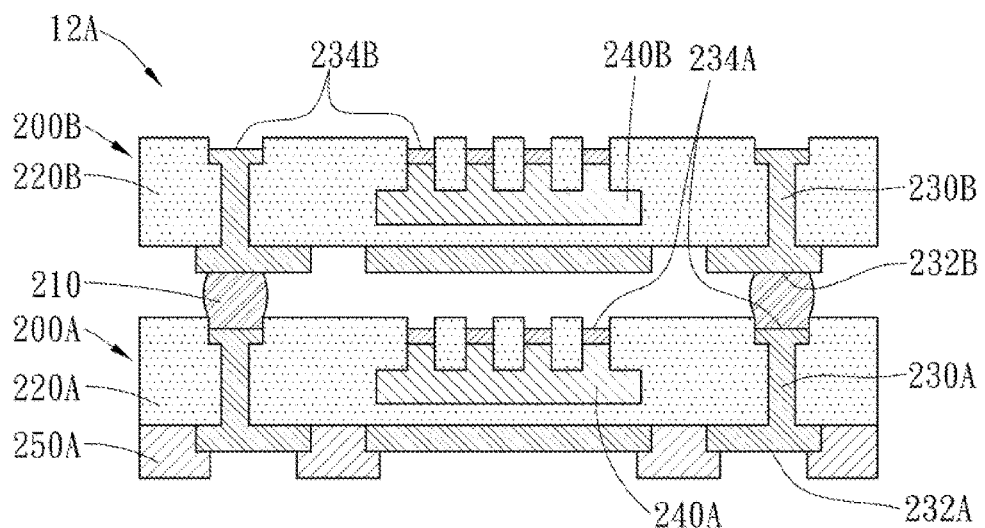
FIG. 12A is a schematic diagram showing a package apparatus according to a fortieth embodiment of the present invention.
Figure 12B:
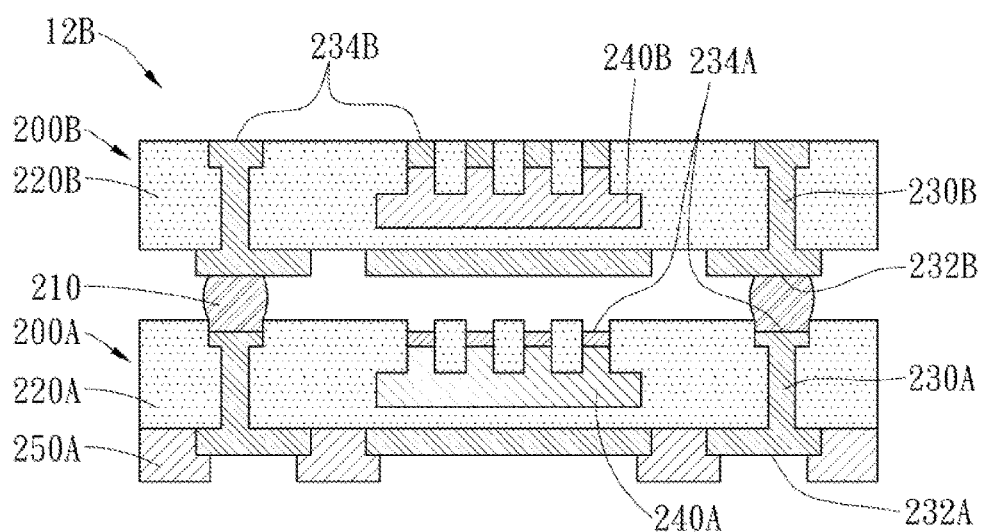
FIG. 12B is a schematic diagram showing a package apparatus according to a forty-first embodiment of the present invention.
Figure 12C:
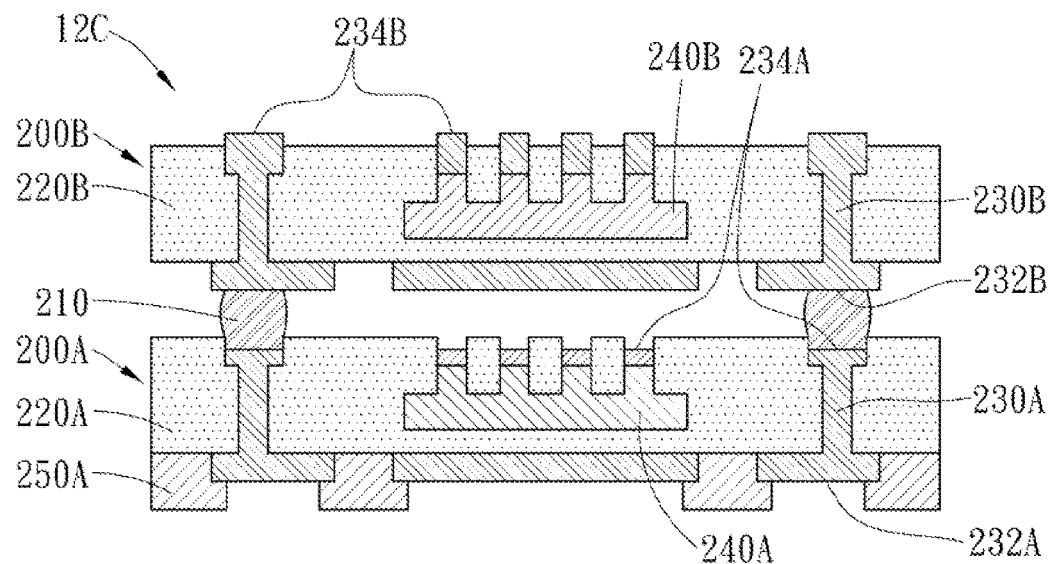
FIG. 12C is a schematic diagram showing a package apparatus according to a forty-second embodiment of the present invention.
Figure 12D:
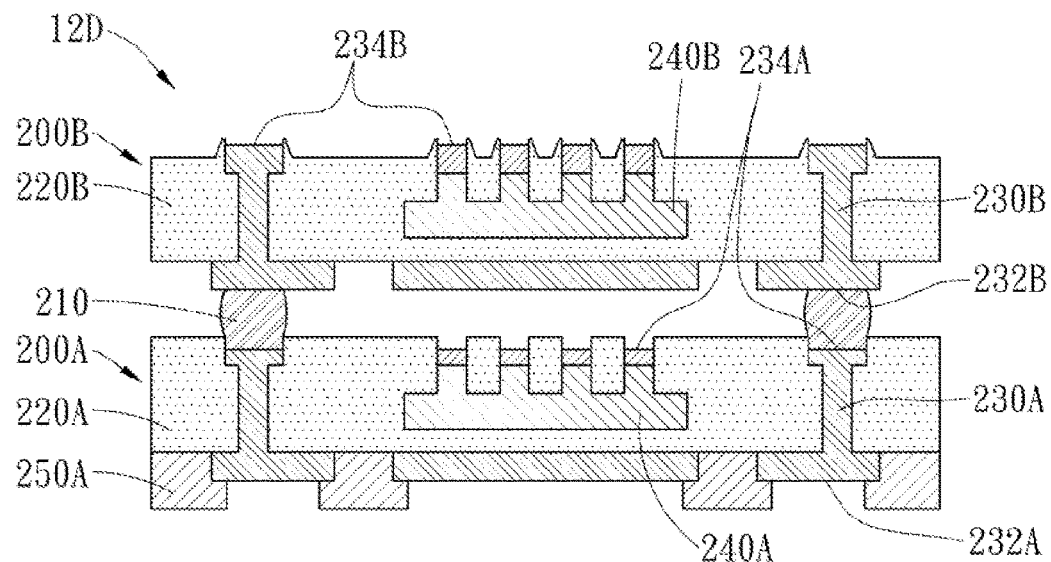
FIG. 12D is a schematic diagram showing a package apparatus according to a forty-third embodiment of the present invention.
Figure 12E:
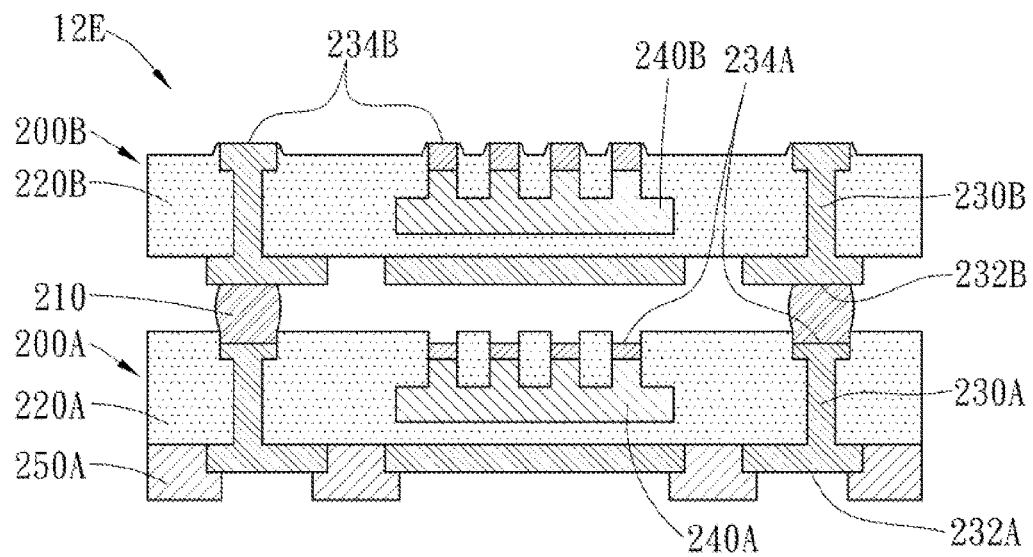
FIG. 12E is a schematic diagram showing a package apparatus according to a forty-fourth embodiment of the present invention.
Figure 12F:
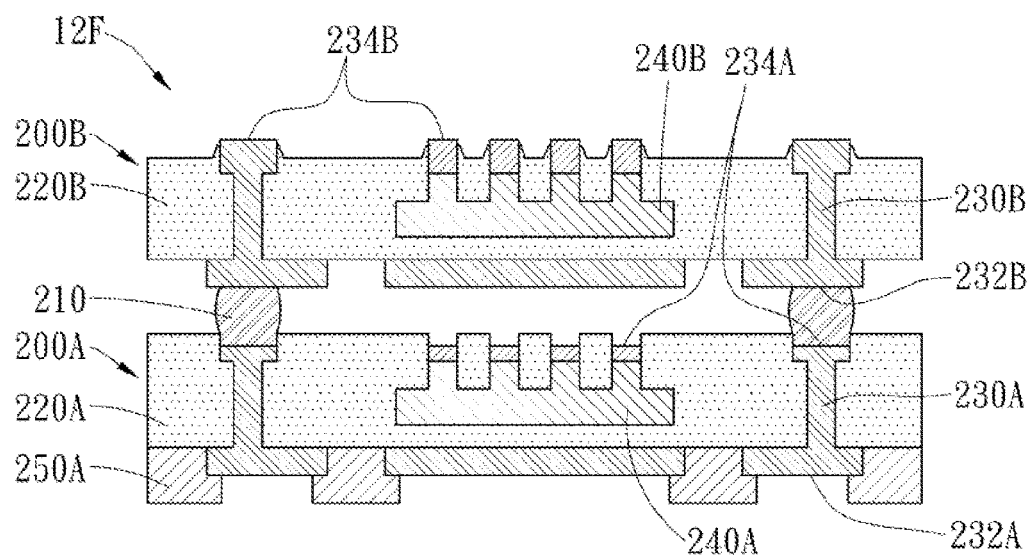
FIG. 12F is a schematic diagram showing a package apparatus according to a forty-fifth embodiment of the present invention.

Please refer to FIG. 12A, which is a schematic diagram showing a package apparatus according to a fortieth embodiment of the present invention. In FIG. 12A, a package apparatus 12A is disclosed, which comprises: a first package module 200A, a second package module 200B and a plurality of conductive elements 210. The first package module 200A comprises: a first molding compound layer 220A, a first conductive pillar layer 230A, a first internal component 240A, and a first protection layer 250A. The first conductive pillar layer 230A is formed with a first surface 232A and a second surface 234A that are arranged opposite to each other while being disposed in the first molding compound layer 220A. The first internal component 240A is electrical connected to the first conductive pillar layer 230A and disposed in the first molding compound layer 220A. The first protection layer 250A is disposed on the first molding compound layer 220A and the first surface 232A of the first conductive pillar layer 230A.

Similarly, the second package module 200B comprises: a second molding compound layer 220B, a second conductive pillar layer 230B, and a second internal component 240B. The second conductive pillar layer 220B is formed with a first surface 232B and a second surface opposite to each other and disposed in the second molding compound layer 220B. The second internal component 240B is electrical connected to the second conductive pillar layer 230B and disposed in the second molding compound layer 220B.

Moreover, the plural conductive elements 210 are disposed between the second surface 234A of the first conductive pillar layer 230A and the second surface 234B of the second conductive pillar layer 230B. In this embodiment, the plural conductive elements 210 are disposed outside an area enclosed and defined by the first internal component 240A and the second internal component 240B while being positioned between the second surface 234A of the first conductive pillar layer 230A and the second surface 234B of the second conductive pillar layer 230B. That is, there will be no such conductive elements 210 being disposed and packaged for electrical connection between the second surface 234A of the first conductive pillar layer 230A and the second surface 234B of the second conductive pillar layer 230B that is in an area defined by the enclosure of the first internal component 240A and the second internal component 240B, but the arrangement of the conductive elements 210 is not limited thereby.

The difference between the present package apparatus 12A of the fortieth embodiment with the package apparatus 2A of the first embodiment is that: in the package apparatus 2A, the first package module 200A is arranged and packaged in a direction opposite to the second package module 200B, but in the package apparatus 12A, the first package module 200A and the second package module 200B are arranged and packaged in a same direction, but it is not limited thereby.

In an embodiment, each of the first molding compound layer 220A and the second molding compound layer can be made from a molding compound material for chip packaging that is selected from novolac-based resin, epoxy-based resin, silicon-based resin or other molding compounds.

In another embodiment of the present invention, each of the second surface 234A of the first conductive pillar layer 230A and the second surface 234B of the second conductive pillar layer 230B includes at least one wire or at least one chip seat, whereas both the first conductive pillar layer 230A and the second conductive pillar layer 230B can be made of a metal, such as copper. In addition, the second surface 234A of the first conductive pillar layer 230A and the second surface 234B of the second conductive pillar layer 230B can both be made as a ball grid array (BGA) electrode layer, by that the first internal component 240A can be electrically connected to the first conductive pillar layer 230A by either a wiring bonding manner or a bump bonding manner, and the second internal component 240B can also be electrically connected to the second conductive pillar layer 230B by either a wiring bonding manner or a bump bonding manner, whereas each of the first and the second internal components 240A, 240B is a component selected from the group consisting of: an active component, a passive element, and a semiconductor chip. In the present embodiment, the first internal component 240A is electrically connected to the first conductive pillar layer 230A by a bump bonding manner, while the second internal component 240B is also electrically connected to the second conductive pillar layer 230B by a bump bonding manner, but it is not limited thereby.

In addition, the second surface 234A of the first conductive pillar layer 230A is either higher than or not higher than the first molding compound layer 220A, and similarly the second surface 234B of the second conductive pillar layer 230B is higher than or not higher than the second molding compound layer 220B. In this embodiment, the second surface 234A of the first conductive pillar layer 230A is lower than the first molding compound layer 220A, while the second surface 234B of the second conductive pillar layer 230B is lower than the second molding compound layer 220B, but it is not limited thereby.

Please refer to FIG. 12B to FIG. 12F, which are schematic diagrams respectively showing a package apparatus according to a forty-first embodiment to a forty-fifth embodiment of the present invention. Each of the package apparatuses 12B to 12F of these embodiments is structured similar to the package apparatus 12A of the fortieth embodiment, but it is different in that: in the package apparatus 12B, the second surface 234B of the second conductive pillar layer 230B is positioned coplanar with the second molding compound layer 220B; in the package apparatus 12C, the second surface 234B of the second conductive pillar layer 230B is higher than the second molding compound layer 220B; in the package apparatus 12D, the second surface 234B of the second conductive pillar layer 230B is lower than the second molding compound layer 220B, while allowing the second molding compound layer 220B to be formed covering all the lateral surface of the second surface 234B of the second conductive pillar layer 230B; in the package apparatus 12E, the second surface 234B of the second conductive pillar layer 230B is positioned coplanar with the second molding compound layer 220B, while allowing the second molding compound layer 220B to be formed covering all the lateral surface of the second surface 234B of the second conductive pillar layer 230B; and in the package apparatus 12F, the second surface 234B of the second conductive pillar layer 230B is higher than the second molding compound layer 220B, while allowing the second molding compound layer 220B to be formed covering a specific portion of the lateral surface of the second surface 234B of the second conductive pillar layer 230B.

Figure 13A:
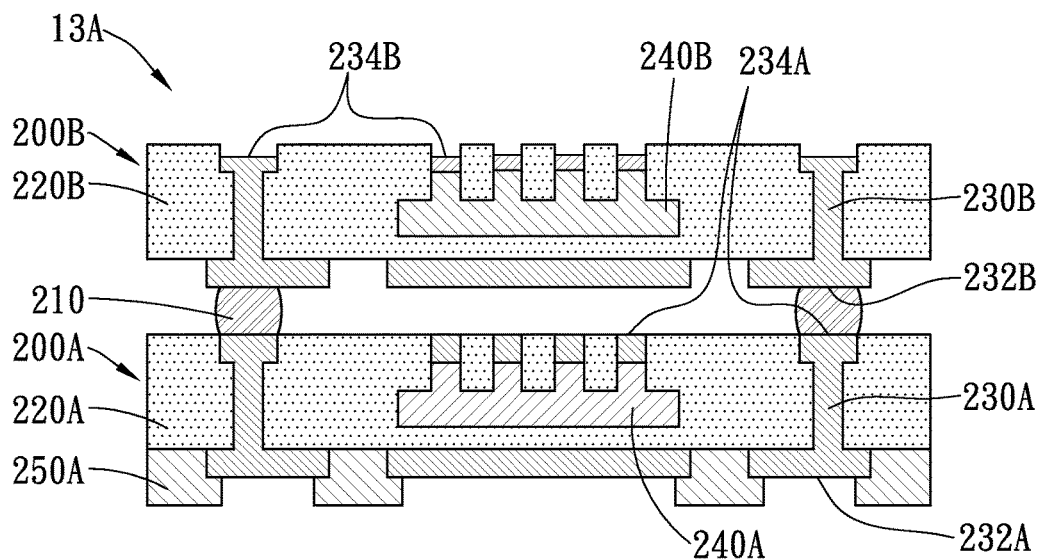
FIG. 13A is a schematic diagram showing a package apparatus according to a forty-sixth embodiment of the present invention.

Please refer to FIG. 13A, which is a schematic diagram showing a package apparatus according to a forty-sixth embodiment of the present invention. The package apparatus 13A of this forty-sixth embodiment is structured similar to the package apparatus 12A of the fortieth embodiment, but is different in that: in the package apparatus 13A, the second surface 234A of the first conductive pillar layer 230A is positioned coplanar with the first molding compound layer 220A, despite that the second surface 234B of the second conductive pillar layer 230B is lower than the second molding compound layer 220B. Moreover, the apparatus shown in this forty-sixth embodiment can be varied in many ways similar to those aforesaid embodiments, such as the second surface 234B of the second conductive pillar layer 230B can be positioned coplanar with or higher than the second molding compound layer 220B, while allowing the second molding compound layer 220B to be formed covering all or a specific portion of the lateral surface of the second surface 234B of the second conductive pillar layer 230B. Thus, the similarity will not be described further herein.

Figure 14A:
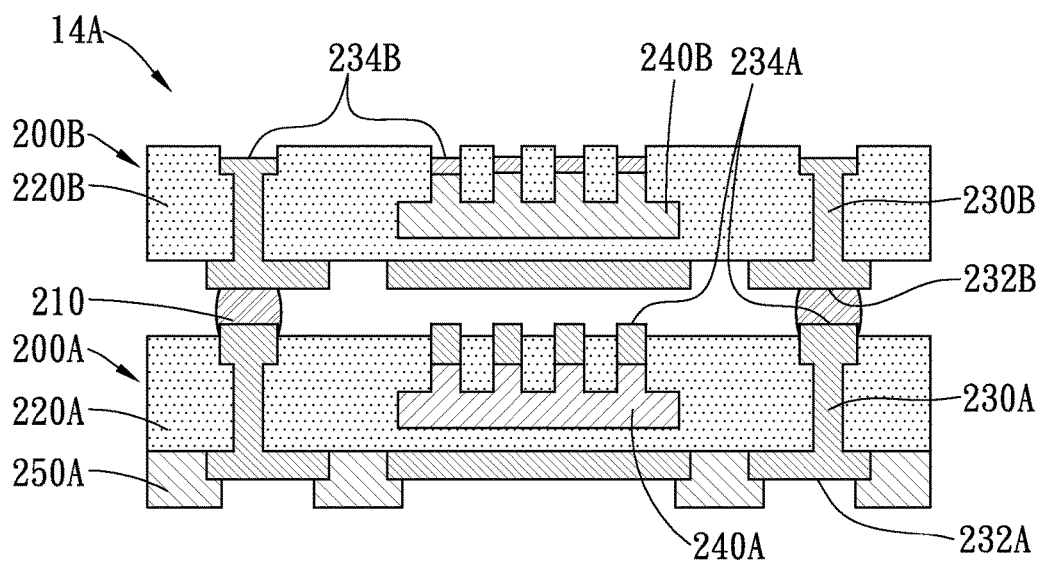
FIG. 14A is a schematic diagram showing a package apparatus according to a forty-seventh embodiment of the present invention.

Please refer to FIG. 14A, which is a schematic diagram showing a package apparatus according to a forty-seventh embodiment of the present invention. The package apparatus 14A of this forty-seventh embodiment is structured similar to the package apparatus 12A of the fortieth embodiment, but is different in that: in the package apparatus 4A, the second surface 234A of the first conductive pillar layer 230A is higher than the first molding compound layer 220A, despite that the second surface 234B of the second conductive pillar layer 230B is lower than the second molding compound layer 220B. Moreover, the apparatus shown in this forty-seventh embodiment can be varied in many ways similar to those aforesaid embodiments, such as the second surface 234B of the second conductive pillar layer 230B can be positioned coplanar with or higher than the second molding compound layer 220B, while allowing the second molding compound layer 220B to be formed covering all or a specific portion of the lateral surface of the second surface 234B of the second conductive pillar layer 230B. Thus, the similarity will not be described further herein.

Figure 15A:
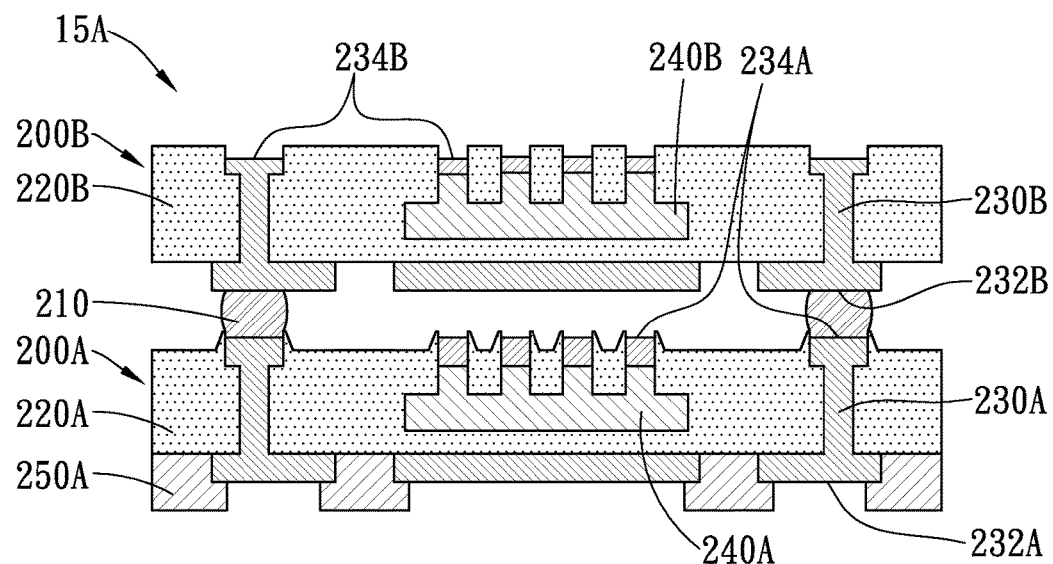
FIG. 15A is a schematic diagram showing a package apparatus according to a forty-eighth embodiment of the present invention.

Please refer to FIG. 15A, which is a schematic diagram showing a package apparatus according to a forty-eighth embodiment of the present invention. The package apparatus 15A of this forty-eighth embodiment is structured similar to the package apparatus 12A of the fortieth embodiment, but is different in that: in the package apparatus 15A, the second surface 234A of the first conductive pillar layer 230A is lower than the first molding compound layer 220A while allowing the first molding compound layer 220A to be formed covering all the lateral surface of the second surface 234A of the first conductive pillar layer 230A, despite that the second surface 234B of the second conductive pillar layer 230B is still lower than the second molding compound layer 220B. Moreover, the apparatus shown in this forty-sixth embodiment can be varied in many ways similar to those aforesaid embodiments, such as the second surface 234B of the second conductive pillar layer 230B can be positioned coplanar with or higher than the second molding compound layer 220B, while allowing the second molding compound layer 220B to be formed covering all or a specific portion of the lateral surface of the second surface 234B of the second conductive pillar layer 230B. Thus, the similarity will not be described further herein.

Figure 16A:
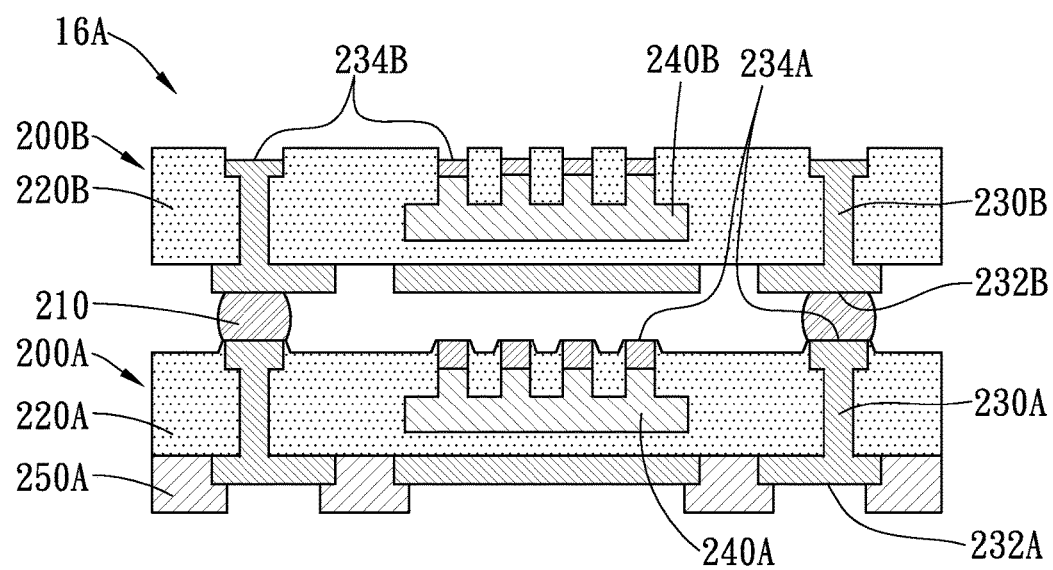
FIG. 16A is a schematic diagram showing a package apparatus according to a forty-ninth embodiment of the present invention.

Please refer to FIG. 16A, which is a schematic diagram showing a package apparatus according to a forty-ninth embodiment of the present invention. The package apparatus 16A of this forty-ninth embodiment is structured similar to the package apparatus 12A of the fortieth embodiment, but is different in that: in the package apparatus 16A, the second surface 234A of the first conductive pillar layer 230A is positioned coplanar with the first molding compound layer 220A while allowing the first molding compound layer 220A to be formed covering all the lateral surface of the second surface 234A of the first conductive pillar layer 230A, despite that the second surface 234B of the second conductive pillar layer 230B is still lower than the second molding compound layer 220B. Moreover, the apparatus shown in this forty-sixth embodiment can be varied in many ways similar to those aforesaid embodiments, such as the second surface 234B of the second conductive pillar layer 230B can be positioned coplanar with or higher than the second molding compound layer 220B, while allowing the second molding compound layer 220B to be formed covering all or a specific portion of the lateral surface of the second surface 234B of the second conductive pillar layer 230B. Thus, the similarity will not be described further herein.

Figure 17A:
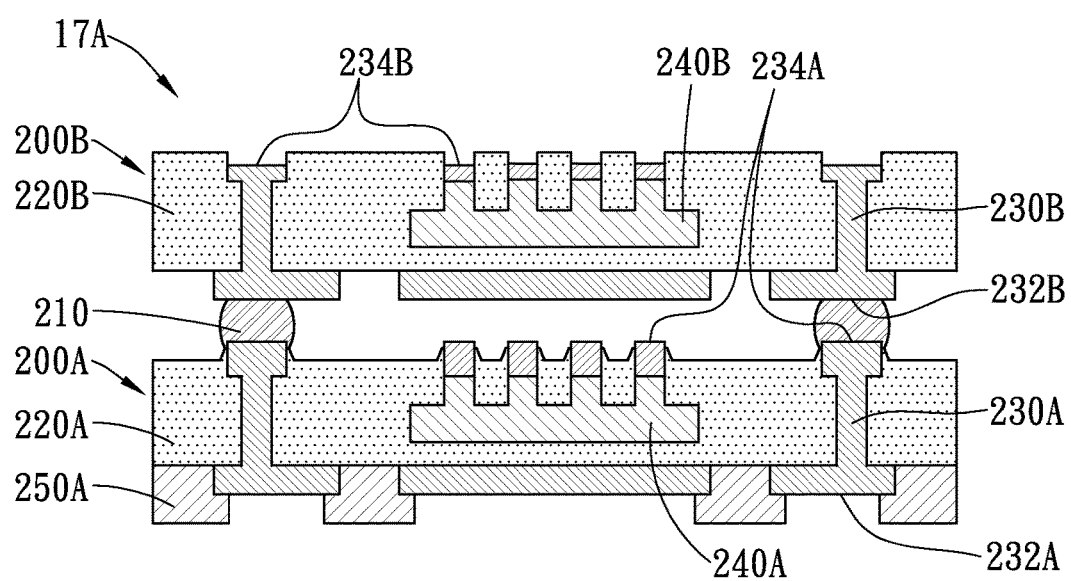
FIG. 17A is a schematic diagram showing a package apparatus according to a fiftieth embodiment of the present invention.

Please refer to FIG. 17A, which is a schematic diagram showing a package apparatus according to a seventieth embodiment of the present invention. The package apparatus 17A of this seventieth embodiment is structured similar to the package apparatus 12A of the fortieth embodiment, but is different in that: in the package apparatus 17A, the second surface 234A of the first conductive pillar layer 230A is higher than the first molding compound layer 220A while allowing the first molding compound layer 220A to be formed covering all the lateral surface of the second surface 234A of the first conductive pillar layer 230A, despite that the second surface 234B of the second conductive pillar layer 230B is still lower than the second molding compound layer 220B. Moreover, the apparatus shown in this forty-sixth embodiment can be varied in many ways similar to those aforesaid embodiments, such as the second surface 234B of the second conductive pillar layer 230B can be positioned coplanar with or higher than the second molding compound layer 220B, while allowing the second molding compound layer 220B to be formed covering all or a specific portion of the lateral surface of the second surface 234B of the second conductive pillar layer 230B. Thus, the similarity will not be described further herein.

Figure 18A:
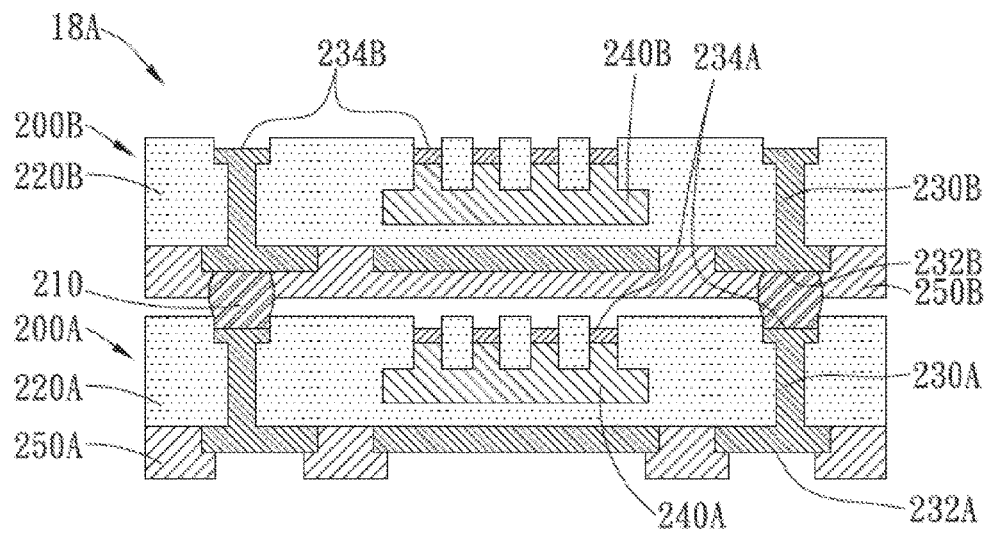
FIG. 18A is a schematic diagram showing a package apparatus according to a fifty-first embodiment of the present invention.

Please refer to FIG. 18A, which is a schematic diagram showing a package apparatus according to a fifty-first embodiment of the present invention. The package apparatus 18A of this fifty-first embodiment is structured similar to the package apparatus 12A of the fortieth embodiment, but is different in that: in the package apparatus of FIG. 18A, the second package module 200B further comprises a second protection layer 250B that is disposed on the second molding compound layer 220B and the first surface 232B of the second conductive pillar layer 230B, but it is not limited thereby.

Figure 18B:
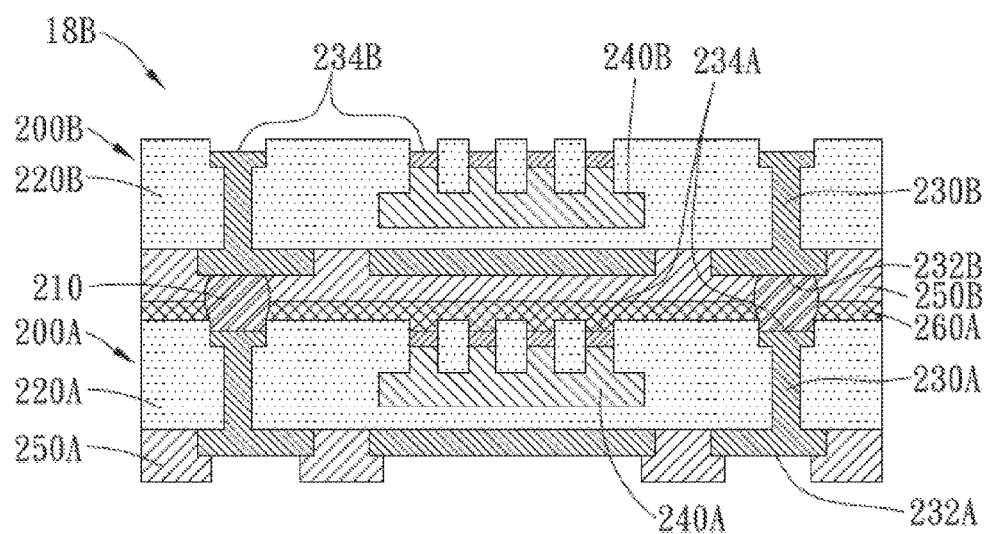
FIG. 18B is a schematic diagram showing a package apparatus according to a fifty-second embodiment of the present invention.

Please refer to FIG. 18B, which is a schematic diagram showing a package apparatus according to a fifty-second embodiment of the present invention. The package apparatus 18B of this fifty-second embodiment is structured similar to the package apparatus 18A of the fifty-first embodiment, but is different in that: in the package apparatus of FIG. 18B, the package apparatus 18B further comprises: a first adhesive layer 260A that is disposed at a position between the first molding compound layer 220A and the second molding compound layer 220B while allowing the plural conductive elements 210 to be disposed inside the first adhesive layer 260A, but it is not limited thereby.

Figure 19:
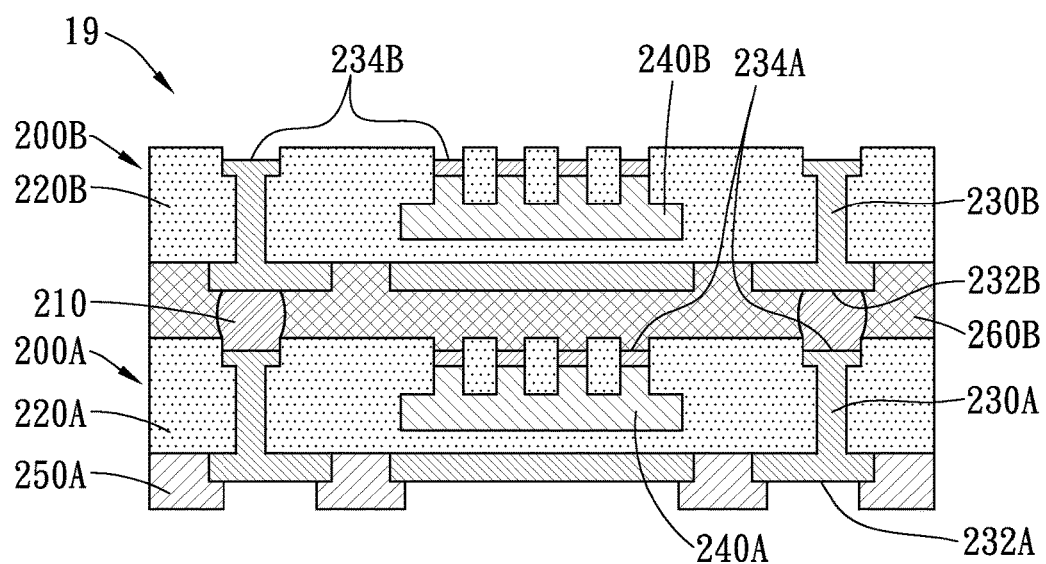
FIG. 19 is a schematic diagram showing a package apparatus according to a fifty-third embodiment of the present invention.

Please refer to FIG. 19, which is a schematic diagram showing a package apparatus according to a fifty-third embodiment of the present invention. The package apparatus 19 of this thirty-ninth embodiment is structured similar to the package apparatus 12A of the fortieth embodiment, but is different in that: in the package apparatus of FIG. 19, the package apparatus 19 further comprises: a second adhesive layer 260B that is disposed at a position between the first molding compound layer 220A and the second molding compound layer 220B while allowing the plural conductive elements 210 to be disposed inside the second adhesive layer 260B, but it is not limited thereby.

Figure 20A:
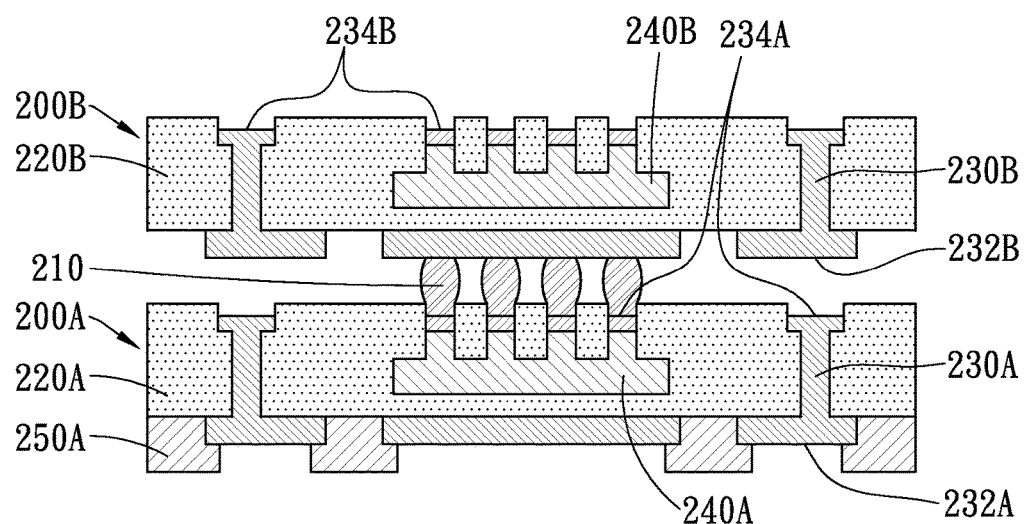
FIG. 20A is a schematic diagram illustrating the manufacturing of a package apparatus of the fortieth embodiment.

Please refer to FIG. 20A, which is a schematic diagram illustrating the manufacturing of a package apparatus of the fortieth embodiment. In FIG. 20A, the plural conductive elements 210 are only being disposed inside an area enclosed and defined by the first internal component 240A and the second internal component 240B while being positioned between the second surface 234A of the first conductive pillar layer 230A and the second surface 234B of the second conductive pillar layer 230B. That is, the electrical connection between the first package module 200A and the second package module 200B is achieved only by the electrical connection of the first internal component 240A and the second internal component 240B.

Figure 20B:
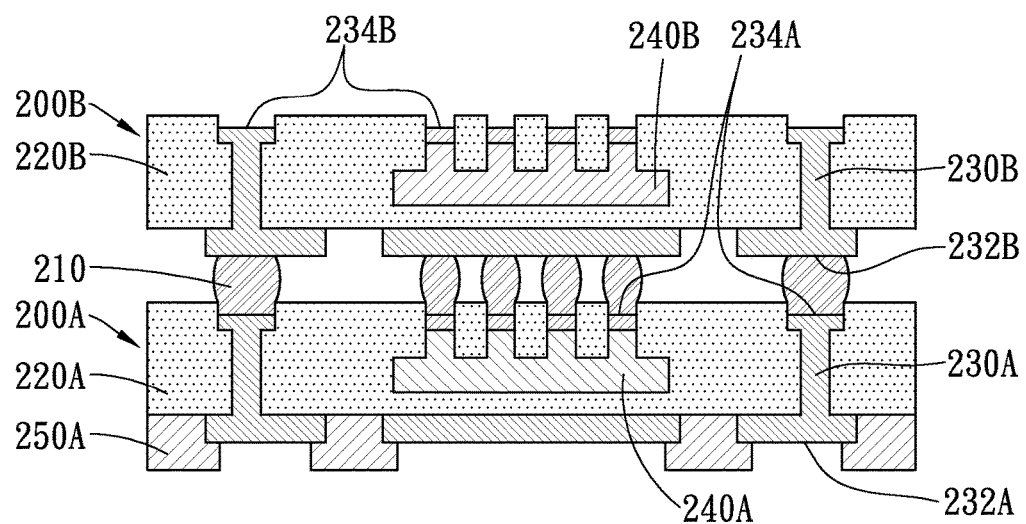
FIG. 20B is a schematic diagram illustrating another manufacturing of a package apparatus of the fortieth embodiment.

Please refer to FIG. 20B, which is a schematic diagram illustrating another manufacturing of a package apparatus of the fortieth embodiment. In FIG. 20B, the plural conductive elements 210 are disposed and sandwiched between the second surface 234A of the first conductive pillar layer 230A of the first package module 200A and the second surface 234B of the second conductive pillar layer 230B of the second package module 200B.

Notably, the aforesaid package apparatuses shown in FIG. 12B to FIG. 19 can be formed in the same the same as those disclosed in FIG. 20A and FIG. 20B, are thus will not be described further herein.

Figure 20C:
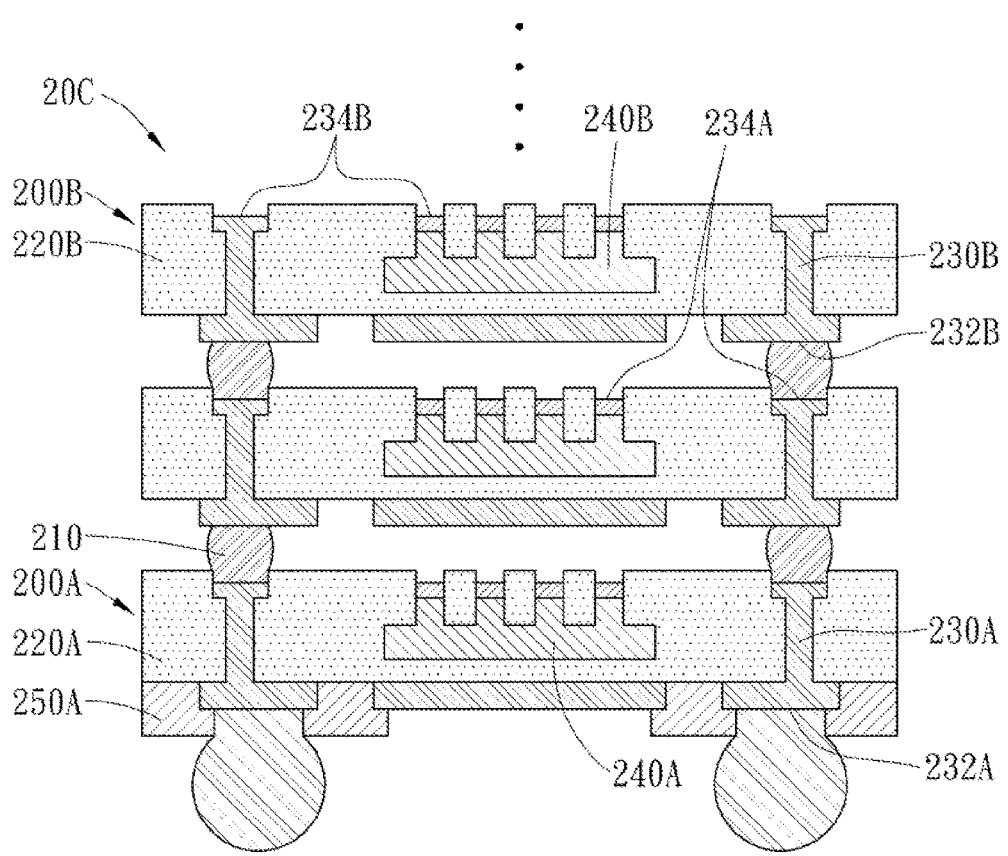
FIG. 20C is a schematic diagram illustrating a package apparatus with multi-layered metal laminated structure according to the fortieth embodiment.

Please refer to FIG. 20C, which is a schematic diagram illustrating a package apparatus with multi-layered metal laminated structure according to the fortieth embodiment. The package apparatus with multi-layered metal laminated structure 20C is substantially a package apparatus 12A that is formed with a plurality of the second package modules 200B, a plurality of conductive elements and a plurality of solder balls 270A. The solder balls 270A are disposed electrically connected to the first surface 232A of the first conductive pillar layer 230A. Each of the plural second package modules 200B, excepting the one that is disposed in front of the other second package modules 200B, are packaged and electrically connecting to the first surface 232B of the second conductive pillar layer 230B of the other second package module 200B that is being disposed in front of the referring second package module 200B by the conductive elements 210, but it is not limited thereby. Notably, the aforesaid package apparatuses 12B to 19 can be formed in the same the same as that disclosed in FIG. 20C, are thus will not be described further herein.

From the above embodiment, it is noted that when the second surface 234A of the first conductive pillar layer 230A is positioned lower than the first molding compound layer 220A, or when the second surface 234B of the second conductive pillar layer 230B is positioned lower than the second molding compound layer 220B, the plural conductive elements are respectively disposed embedding inside either the grooves of the first molding compound layer 220A or the grooves of the second molding compound layer 220B to be used for enabling electrical connection. It is noted that the grooves of the first molding compound layer 220A and the second molding compound layer 220B are provided for fixing the plural conductive elements 210 for preventing the same from any horizontal movement outside the molding compound layers, and thus preventing short circuiting between conductive pillar layers. In addition, the second surface 234A of the first conductive pillar layer 230A as well as the second surface 234B of the second conductive pillar layer 230B can be etched into an arc-shaped concave surface so as to effectively fixing the plural conductive elements 210, by that the resolution of solder mask opens in the BGA is enhanced.

Similarly, when the second surface 234A of the first conductive pillar layer 230A is positioned lower than the first molding compound layer 220A while allowing the first molding compound layer to be formed covering all the lateral surface of the second surface 234A of the first conductive pillar layer 230A, or when the second surface 234B of the second conductive pillar layer 230B is lower than the second molding compound layer 220B while allowing the second molding compound layer 230B to be formed covering all the lateral surface of the second surface 234B of the second conductive pillar layer 230B, the plural conductive elements are respectively disposed embedding inside either the grooves of the first molding compound layer 220A or the grooves of the second molding compound layer 220B to be used for enabling electrical connection. It is noted that the grooves of the first molding compound layer 220A and the second molding compound layer 220B are provided for fixing the plural conductive elements 210 for preventing the same from any downward movement outside the molding compound layers, and thus preventing short circuiting between conductive pillar layers. In addition, the second surface 234A of the first conductive pillar layer 230A as well as the second surface 234B of the second conductive pillar layer 230B can be etched into an arc-shaped concave surface so as to effectively fixing the plural conductive elements 210, by that the resolution of solder mask opens in the BGA is enhanced.

Figure 21:
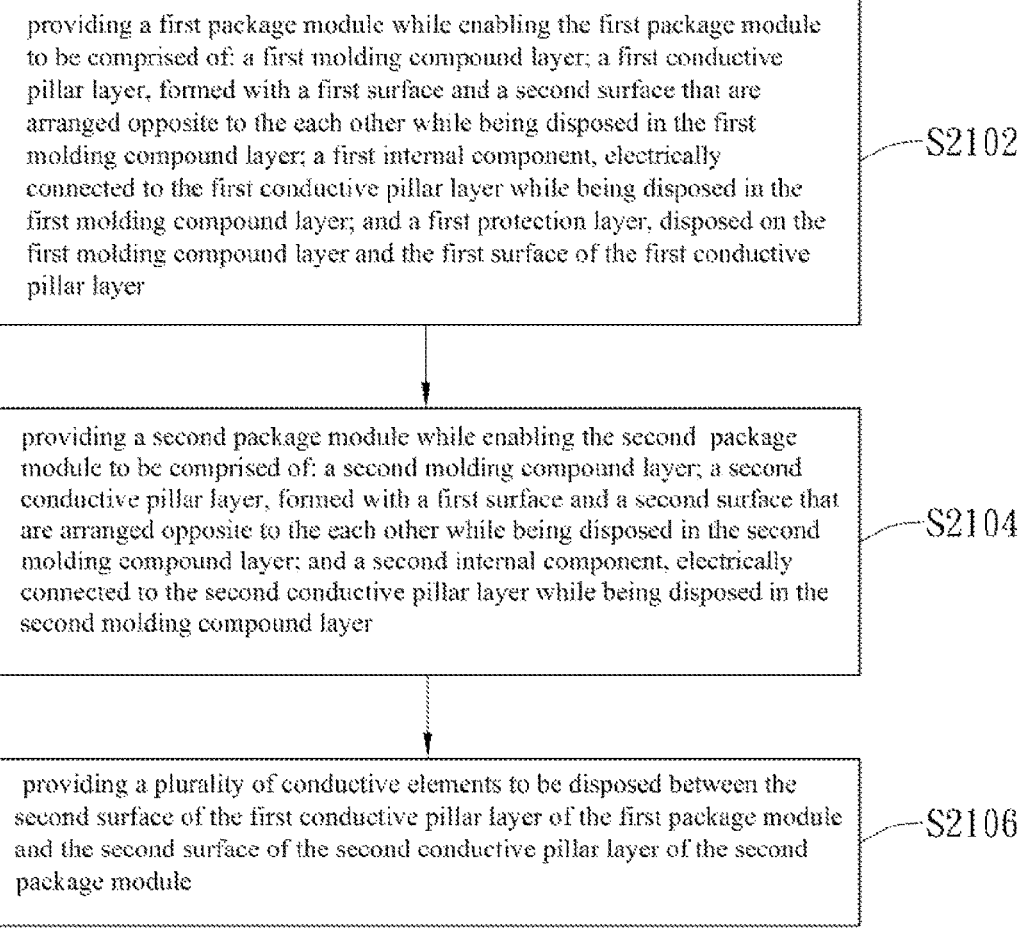
FIG. 21 is a flow chart depicting steps performing in a method for manufacturing a package apparatus of the fortieth embodiment.

Please refer to FIG. 21, which is a flow chart depicting steps performing in a method for manufacturing a package apparatus of the fortieth embodiment. The method for manufacturing a package apparatus of the first embodiment of FIG. 21 comprises the following steps:

step S2102: providing a first package module 200A while enabling the first package module 200A to be comprised of: a first molding compound layer 220A; a first conductive pillar layer 230A, formed with a first surface 232A and a second surface 234A that are arranged opposite to the each other while being disposed in the first molding compound layer 220A; a first internal component 240A, electrically connected to the first conductive pillar layer 230A while being disposed in the first molding compound layer 220A; and a first protection layer, disposed on the first molding compound layer and the first surface of the first conductive pillar layer; whereas, the first conductive pillar layer 230A can be formed by the use of an electrolytic plating process, an electroless plating process, a sputtering coating process, or a thermal coating process, but is not limited thereby, and moreover, each of the first surface 232A and the second surface 234A of the first conductive pillar layer 230A can be a wiring layer with patterns which includes at least one wire or at least one chip seat, and can be made of a metal, such as copper; in addition, in this embodiment, the first molding compound layer 220A is formed by a process selected from the group consisting of: a transfer molding process, a top molding process, a compression molding process, an injection molding process and a vacuum casting molding process, and can be made from a material selected from the group consisting of novolac-based resin, epoxy-based resin, silicon-based resin and other molding compounds, whichever can be heated to a liquid state so as to be poured on the first conductive pillar layer 230A for allowing the same to cover all or a portion of the first conductive pillar layer 230A, under a high-temperature and high-pressure condition, and thereafter, to be cured into the first molding compound layer 220A, and moreover the first molding compound layer 220A can be composed of a kind of filler, such as a power silicon dioxide; and correspondingly in another embodiment, the formation of the first molding compound layer 220A can include the steps of: providing a molding compound to be heated to a liquid state, whereas the molding compound is composed of a resin and power silicon dioxide; pouring the liquefied molding compound on a metal carrier while allowing the molding compound to cover all or a portion of the first conductive pillar layer 230A under a high-temperature and high-pressure condition; and curing the molding compound for enabling the same to form the first molding compound layer 220A, but is not limited thereby;

step S2104: providing a second package module 200B while enabling the second package module 200B to be comprised of: a second molding compound layer 220B; a second conductive pillar layer 230B, formed with a first surface 232B and a second surface 234B that are arranged opposite to the each other while being disposed in the second molding compound layer 220B; and a second internal component 240B, electrically connected to the second conductive pillar layer 230B while being disposed in the second molding compound layer 220B; whereas, the second conductive pillar layer 230B can be formed in a way similar to that of the first conductive pillar layer 230A, and moreover, each of the first surface 232B and the second surface 234B of the second conductive pillar layer 230B can be a wiring layer with patterns which includes at least one wire or at least one chip seat, and can be made of a metal, such as copper; in addition, in this embodiment, the second molding compound layer 220B is formed in a way similar to that of the first molding compound layer 220A, and can be made from a material similar to that of the first molding compound layer 220A;

step S2106: providing a plurality of conductive elements 210 to be disposed between the second surface 234A of the first conductive pillar layer 230A of the first package module 200A and the second surface 234B of the second conductive pillar layer 230B of the second package module 200B, whereas each of the conductive elements 210 can be made of a metal, such as copper; and in an embodiment, the second surface 234A of the first conductive pillar layer 230A as well as the second surface 234B of the second conductive pillar layer 230B can be etched into an arc-shaped concave surface so as to effectively fixing the plural conductive elements 210, but is not limited thereby.

To sum up, in the present invention a molding compound layer is used as the major material in the manufacturing of a coreless substrate, and moreover, a package module can be fabricating by the embedding of chips inside the coreless substrate to act as and replace the function of a convention fiberglass substrate so as to be used for replacing the role of a conventional fiberglass substrate, and after a plurality of such package modules are formed, they are laminated and interconnected and packaged into a multi-chip package.

The overall cost of the whole package process can be reduced, the size and thickness of the resulted package structure can also be reduced significantly, and thereby, it can be used for achieving a thinner, lighter and smaller electronic product with great portability. Moreover, as the internal components are embedded inside the structure, the whole transmission path in the structure is shortened for facilitating the requirement of high-speed signal transmission, noise reduction and power consumption, and also the reliability of three-dimension packaging is enhanced.

Furthermore, by the formation of grooves in the package apparatus, the present can be favored by the following advantages: (1) as the plural conductive elements are respectively disposed embedding inside the grooves of the first molding compound layer 220A or the grooves of the second molding compound layer 220B while to be used for enabling electrical connection and simultaneously for fixing the plural conductive elements 210 for preventing the same from any horizontal movement outside the molding compound layers, the problems of short circuiting between conductive pillar layers can be prevented; (2) In a similar manner, the plural conductive elements 210 are fixed for preventing the same from any downward movement outside the molding compound layers, so that the problems of short circuiting between conductive pillar layers can be prevented; (3) In addition, the second surfaces of those conductive pillar layers are etched into an arc-shaped concave surface so as to effectively fixing the plural conductive elements 210, by that the resolution of solder mask opens in the BGA is enhanced, and thus the reliability of a posterior multi-layer lamination packaging process is enhanced.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

What is claimed is:
1. A package apparatus, comprising:
a first package module, comprising:
  a first molding compound layer;
  a first conductive pillar layer, disposed in the first molding compound layer, comprising:
    a plurality of first surfaces facing a first direction; and
    a plurality of second surfaces facing a second direction opposite to said first direction;
  a first internal component disposed in the first molding compound layer and electrically connected to the first conductive pillar layer; and
  a first protection layer disposed on the first molding compound layer and the first surfaces;
a second package module, comprising:
  a second molding compound layer;
  a second conductive pillar layer, disposed in the second molding compound layer, comprising:
    a plurality of third surfaces, facing said second direction; and
    a plurality of fourth surfaces facing said first direction; and
  a second internal component disposed in the second molding compound layer and electrically connected to the second conductive pillar layer; and a plurality of conductive elements disposed between the first conductive pillar layer and the second conductive pillar layer,
wherein the first molding compound layer has a plurality of grooves intercalated with said plurality of second surfaces on its upper surface, or the second molding compound layer has a plurality of grooves intercalated with said plurality of fourth surfaces on its lower surface, each groove having:
an opening, and
a basin, spaced from said first conductive pillar layer and said second conductive pillar layer, below the second or fourth surfaces,
wherein said opening is wider than said basin.

2. The package apparatus of claim 1, wherein the second package module comprises a second protection layer disposed on the second molding compound layer and the third surfaces.

3. The package apparatus of claim 1, further comprising a first adhesive layer disposed between the first molding compound layer and the second molding compound layer, wherein the plural conductive elements are disposed on the first adhesive layer.

4. The package apparatus of claim 1, wherein the second surfaces are not higher than the surface of the first molding compound layer.

5. The package apparatus of claim 1, wherein the fourth surfaces are not higher than the surface of the second molding compound layer.

6. The package apparatus of claim 4, wherein the first molding compound layer is formed covering all the lateral surface of the first conductive pillar layer.

7. The package apparatus of claim 5, wherein the second molding compound layer is formed covering all the lateral surface of the second conductive pillar layer.

8. The package apparatus of claim 1, wherein the second surfaces are not higher than the first molding compound layer, and the fourth surfaces are higher than the second molding compound layer.

9. The package apparatus of claim 8, wherein the first molding compound layer is formed covering all the lateral surface of the second surfaces, and the second molding compound layer is formed covering a portion of the lateral surface of the fourth surfaces.

10. The package apparatus of claim 1, wherein the first and the second molding compound layers are made of a molding compound material that is selected from a novolac-based resin, an epoxy-based resin, or a silicon-based resin.

11. The package apparatus of claim 1, further comprising at least one wire or at least one chip seat disposed between the second surfaces and the fourth surfaces.

12. The package apparatus of claim 1, wherein each of the first and the second internal components is an active component or a passive element.

13. The package apparatus of claim 1, wherein the plural conductive elements are disposed inside an area enclosed and defined by the first internal component and the second internal component.

14. The package apparatus of claim 1, wherein the plural conductive elements are disposed outside an area enclosed and defined by the first internal component and the second internal component.

15. The package apparatus of claim 1, wherein the plural conductive elements are disposed between the second surfaces and the fourth surfaces.

16. The package apparatus of claim 1, wherein the plural conductive elements are disposed between the second surfaces and the third surfaces.

17. The package apparatus of claim 1, further comprising a third package module electrically connected to the second package module by the plural conductive elements.

18. The package apparatus of claim 17, wherein the third package module further comprising:
a third molding compound layer;
a third conductive pillar layer disposed in the third molding compound layer; and
a third internal component disposed in the third molding compound layer and electrically connected to the third conductive pillar layer.

19. A method for manufacturing a package apparatus, comprising:
providing a first package module, comprising:
a first molding compound layer;
a first conductive pillar layer, disposed in the first molding compound layer, comprising:
a plurality of first surfaces facing a first direction; and
a plurality of second surfaces facing a second direction opposite to said first direction;
a first internal component disposed in the first molding compound layer and electrically connected to the first conductive pillar layer; and
a first protection layer disposed on the first molding compound layer and the first surfaces;
providing a second package module, comprising:
a second molding compound layer;
a second conductive pillar layer, disposed in the second molding compound layer, comprising:
a plurality of third surfaces, facing said second direction; and
a plurality of fourth surfaces facing said first direction; and
a second internal component disposed in the second molding compound layer and electrically connected to the second conductive pillar layer; and
providing a plurality of conductive elements disposed between the first conductive pillar layer and the second conductive pillar layer,
wherein the first molding compound layer has a plurality of grooves intercalated with said plurality of second surfaces on its upper surface, or the second molding compound layer has a plurality of grooves intercalated with said plurality of fourth surfaces on its lower surface, each groove having:
an opening, and
a basin, spaced from said first conductive pillar layer and said second conductive pillar layer, below the second or fourth surfaces, wherein said opening is wider than said basin.

20. The method for manufacturing a package apparatus of claim 19, wherein the step of providing a first package module comprises electrically connecting the first internal component to the first conductive pillar layer by either wiring bonding or bump bonding, and the step of providing a second package module comprises electrically connecting the second internal component to the second conductive pillar layer by either wiring bonding or bump bonding.

* * * * *